United States Patent
Tajika et al.

(10) Patent No.: US 8,421,200 B2
(45) Date of Patent: Apr. 16, 2013

(54) SEMICONDUCTOR INTEGRATED CIRCUIT DEVICE AND METHOD FOR FABRICATING THE SAME

(75) Inventors: Kenichi Tajika, Kyoto (JP); Takehisa Kishimoto, Shiga (JP)

(73) Assignee: Panasonic Corporation, Osaka (JP)

( * ) Notice: Subject to any disclaimer, the term of this patent is extended or adjusted under 35 U.S.C. 154(b) by 286 days.

(21) Appl. No.: 11/730,635

(22) Filed: Apr. 3, 2007

(65) Prior Publication Data

US 2007/0246816 A1    Oct. 25, 2007

(30) Foreign Application Priority Data

Apr. 25, 2006    (JP) ................. 2006-120376

(51) Int. Cl.
  *H01L 23/02*    (2006.01)
(52) U.S. Cl.
  USPC .... 257/686; 257/621; 257/532; 257/E23.178; 257/E25.01; 438/106; 438/109; 438/113; 438/628; 438/108
(58) Field of Classification Search .......... 257/621, 257/686, 532, 666, E23.178, E25.01; 438/106, 438/109, 113, 628, 108
See application file for complete search history.

(56) References Cited

U.S. PATENT DOCUMENTS

| 2002/0115290 | A1  | 8/2002 | Halahan et al. |
| 2005/0062147 | A1* | 3/2005 | Wakisaka et al. ............. 257/712 |
| 2005/0205968 | A1* | 9/2005 | Kim ............................. 257/621 |
| 2007/0181991 | A1* | 8/2007 | Ishino et al. ................. 257/686 |
| 2008/0217767 | A1  | 9/2008 | Tago |

FOREIGN PATENT DOCUMENTS

| JP | 2001-044357 | 2/2001 |
| JP | 2001-135918 | 5/2001 |
| JP | 2001-177048 | 6/2001 |
| JP | 2001-326326 | 11/2001 |
| JP | 2004-152811 | 5/2004 |

* cited by examiner

*Primary Examiner* — Cathy N Lam
(74) *Attorney, Agent, or Firm* — McDermott Will & Emery LLP

(57) ABSTRACT

A semiconductor integrated circuit device is made by stacking a plurality of semiconductor chips. The semiconductor integrated circuit device includes: a penetrating electrode formed to penetrate the plurality of semiconductor chips; a plurality of electrodes formed in respective layers constituting each of the plurality of semiconductor chips and having respective openings within which the penetrating electrode penetrates; and a plurality of vias each of which electrically connects electrodes of the plurality of electrodes located in adjacent layers. The vias are each formed so that the side face thereof is in contact with the penetrating electrode.

11 Claims, 17 Drawing Sheets

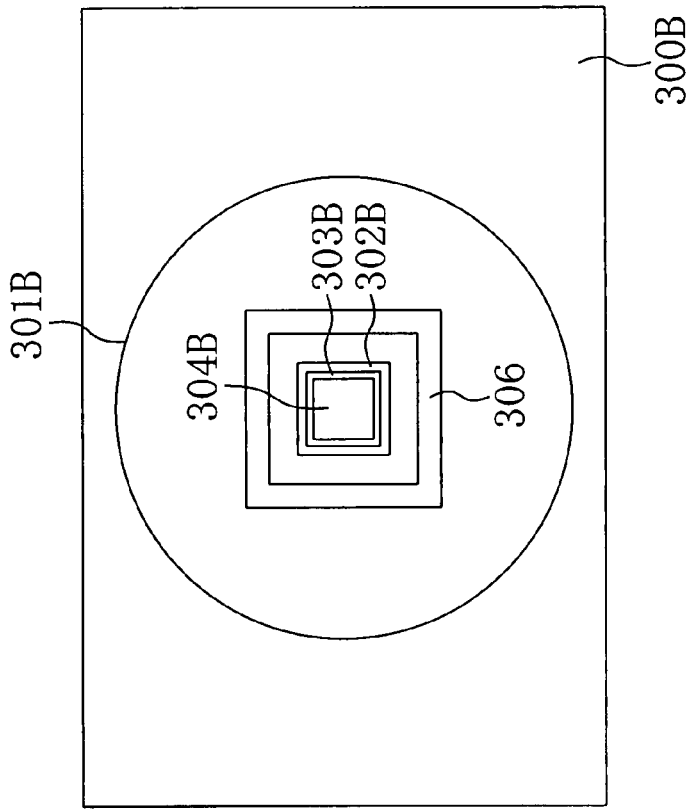
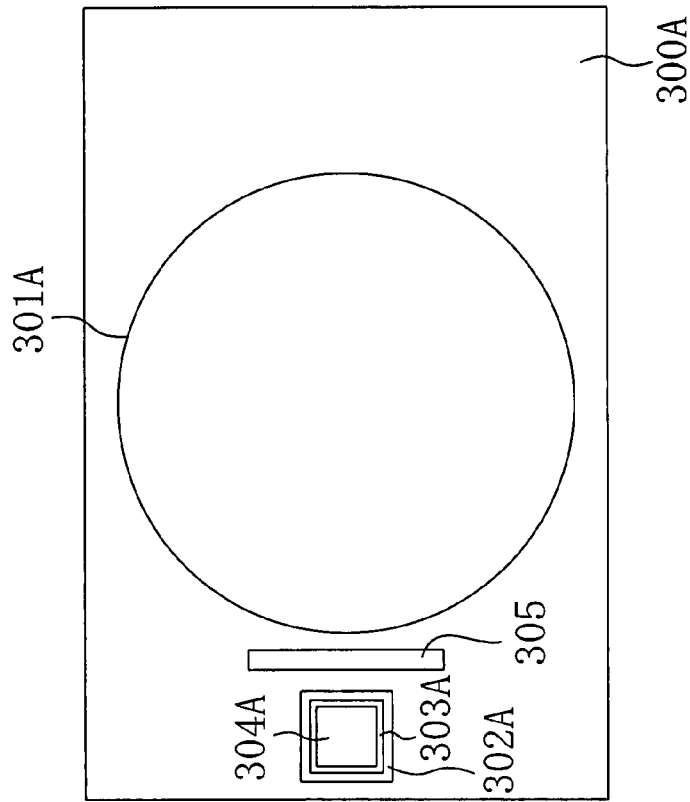

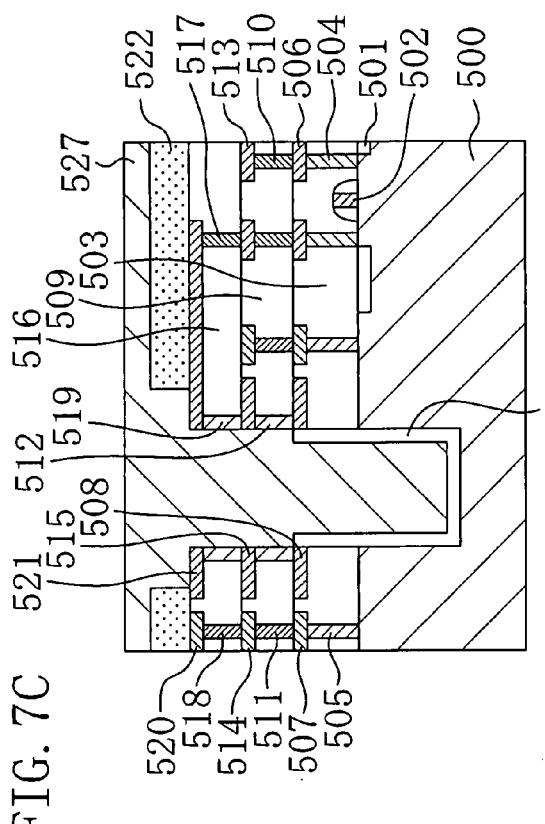
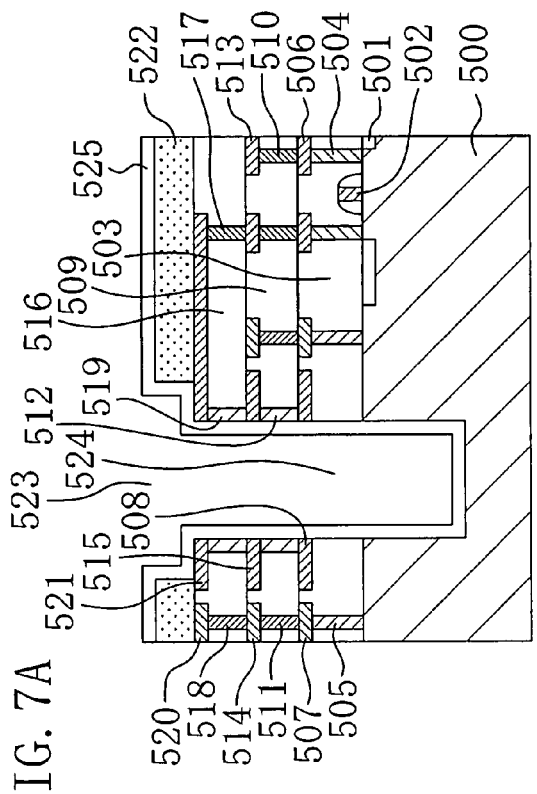
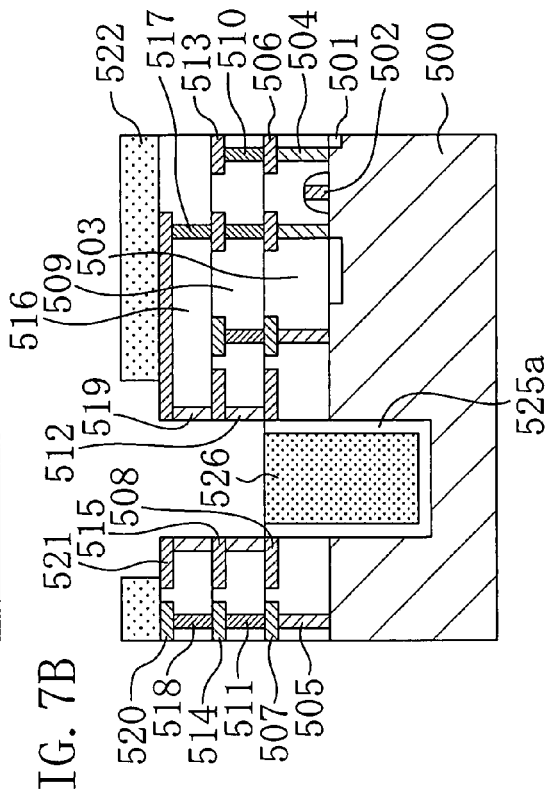
FIG. 7A  FIG. 7B  FIG. 7C  FIG. 7D

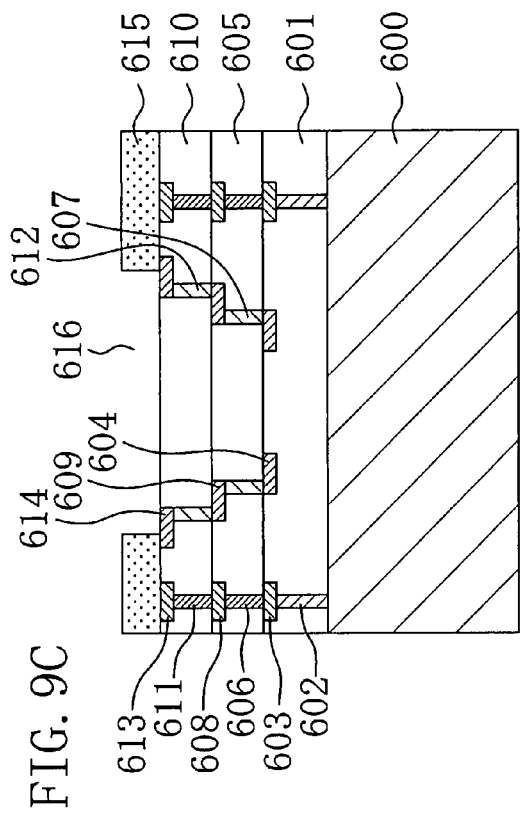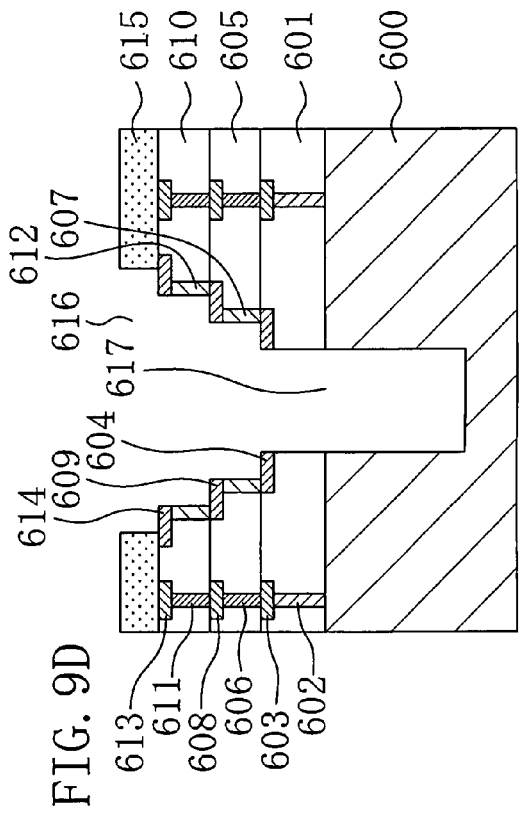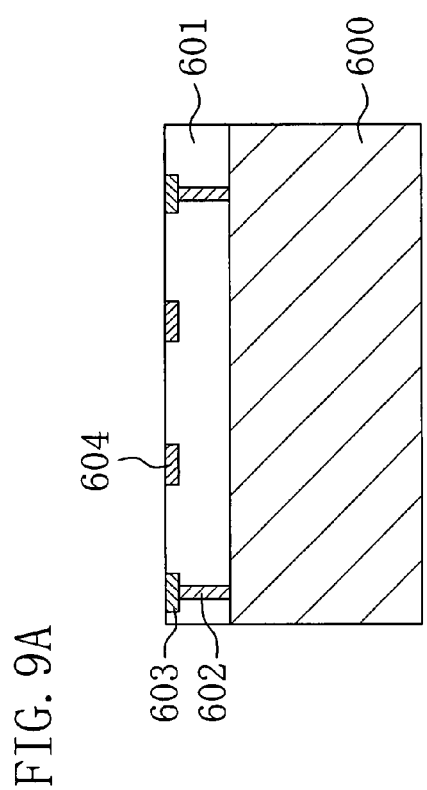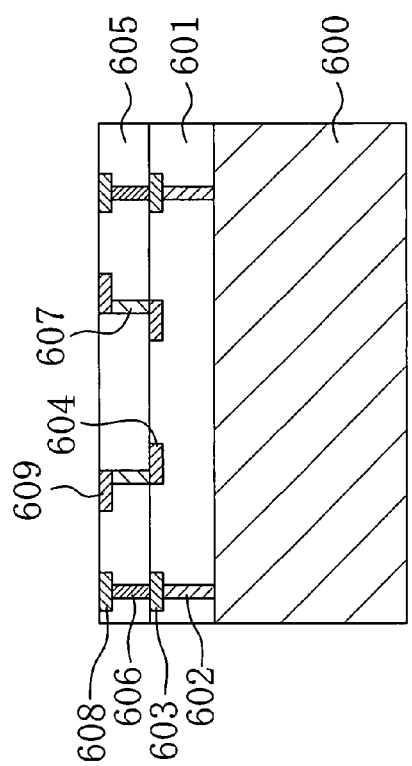

SEMICONDUCTOR INTEGRATED CIRCUIT DEVICE AND METHOD FOR FABRICATING THE SAME

CROSS-REFERENCE TO RELATED APPLICATIONS

This application claims priority under 35 U.S.C. §119 on Patent Application No. 2006-120376 filed in Japan on Apr. 25, 2006, the entire contents of which are hereby incorporated by reference.

BACKGROUND OF THE INVENTION (a) Fields of the Invention

The present invention relates to a semiconductor integrated circuit device and its fabrication method. In particular, the present invention relates to a semiconductor integrated circuit device with a penetrating electrode, a stacked-type semiconductor integrated circuit device in which the multiple semiconductor integrated circuit devices are stacked to achieve greater functionality, smaller size, and smaller thickness, and their fabrication methods.

(b) Description of Related Art

With the recent trend in semiconductor integrated circuit devices toward higher functionalities, the devices have been configured to have large-scale circuitry, resulting in increasing areas of semiconductor chips therein. Among this trend, however, electronic equipment is required to reduce its size and thickness. To address these needs, a SiP (System in Package) technology is proposed as a packaging technology of the semiconductor integrated circuit devices. Such a SiP technology can be employed to provide a semiconductor integrated circuit device in which two or more semiconductor chips are stacked on one semiconductor package, so that size and thickness reductions of electronic equipment can be attained.

However, for the current SiP technology, by employing a wire bonding technology and a CSP (Chip Size Package) technology in combination, a semiconductor chip is connected to a semiconductor package to stack the semiconductor chip on the semiconductor package, thereby fabricating a semiconductor integrated circuit device. As a result of this, there is a limitation on stacking of the semiconductor chips in the z-axis direction.

To cope with this disadvantage, the following SiP technology has been recently proposed. Semiconductor chips are stacked on a semiconductor package, and a through hole penetrating the semiconductor chips is formed. A penetrating electrode made by filling the through hole with a conductive material is provided, and the penetrating electrode connects electrodes of the semiconductor chips to the semiconductor package to fabricate a SiP structure.

Hereinafter, a semiconductor integrated circuit device with a penetrating electrode will be described with reference to FIG. 17 (see, for example, Patent Document 1: Japanese Unexamined Patent Publication No. 2004-152811). FIG. 17 is a schematic cross-sectional view showing the structure of the semiconductor integrated circuit device according to the conventional example.

Referring to FIG. 17, on a semiconductor package 900, semiconductor chips 901A, 901B, 901C, and 901D are sequentially stacked from bottom to top. Layers constituting each of the semiconductor chips 901A to 901D (not shown in detail) are formed with electrodes 902, respectively, and the multiple electrodes 902 contained in the semiconductor chips 901A to 901D are arranged to be stacked vertically.

The semiconductor integrated circuit device according to the conventional example is constructed in the manner in which penetrating electrodes 903 and 904 penetrating the semiconductor chips 901A to 901D connect the electrodes 902 of the semiconductor chips 901A to 901D to the semiconductor package 900 to stack the semiconductor chips 901A to 901D on the semiconductor package 900.

As described above, in the semiconductor integrated circuit device according to the conventional example, the penetrating electrodes connect the electrodes of the semiconductor chips to the semiconductor package. Therefore, the semiconductor integrated circuit device can be fabricated by stacking the semiconductor chips on the semiconductor package with no limitation in the z-axis direction.

The semiconductor integrated circuit device according to the conventional example, however, has the following problems.

In order for the penetrating electrode to electrically connect the electrodes of the semiconductor chips to the semiconductor package, it is necessary to electrically connect the penetrating electrode to the electrodes of the semiconductor chips. However, in the semiconductor integrated circuit device according to the conventional example, the electrical connection points of the penetrating electrode to the electrodes of the semiconductor chip is only the points thereof in contact with the side faces of the electrodes of the semiconductor chip.

Because of this, when a malfunction in formation (for example, a malfunction in formation such as inadequate filling of the through hole with the conductive material or creation of voids) of the penetrating electrode (in particular, the point of the penetrating electrode in contact with the electrode) occurs, the penetrating electrode and the electrode of the semiconductor chip cannot be brought into contact with each other. This causes a first problem that such an imperfect contact (an imperfect electrical contact) between the penetrating electrode and the electrode of the semiconductor chip will degrade the yield of the device.

Furthermore, since the electrical connection points of the penetrating electrode to the electrodes of the semiconductor chip is only the points thereof in contact with the side faces of the electrodes of the semiconductor chip, the area of the electrical connection portion therebetween is small. This causes a second problem that the contact resistance between the penetrating electrode and the electrode of the semiconductor chip increases.

SUMMARY OF THE INVENTION

In view of the foregoing, a first object of the present invention is to prevent degradation in the yield of a semiconductor integrated circuit device due to an imperfect contact between a penetrating electrode and an electrode of a semiconductor chip, and a second object of the present invention is to reduce the contact resistance between the penetrating electrode and the electrode of the semiconductor chip.

To accomplish the first and second objects, a semiconductor integrated circuit device according to a first aspect of the present invention is characterized in that the semiconductor integrated circuit device is made by stacking a plurality of semiconductor chips, and includes: a penetrating electrode formed to penetrate the plurality of semiconductor chips; a plurality of electrodes formed in respective layers constituting each of the plurality of semiconductor chips and having respective openings within which the penetrating electrode penetrates; and a plurality of vias each of which electrically connects electrodes of the plurality of electrodes located in adjacent layers. In this device, the vias are each formed so that the side face thereof is in contact with the penetrating electrode.

With the semiconductor integrated circuit device according to the first aspect of the present invention, the penetrating electrode can be brought into contact not only with the inner surfaces of the electrodes but also with the side faces of the vias.

Thus, the penetrating electrode has, as the points electrically connected to the electrodes, not only the contact points with the inner surfaces of the electrodes but also the contact points with the side faces of the vias. Thereby, the areas of the portions of the penetrating electrode electrically connected to the electrodes can be increased as compared with the case like the conventional example where the penetrating electrode is brought into contact only with the inner surfaces of the electrodes. Therefore, degradation in the yield due to the imperfect contact between the penetrating electrode and the electrode can be prevented, and the contact resistance between the penetrating electrode and the electrode can be reduced.

Preferably, in the semiconductor integrated circuit device according to the first aspect of the present invention, the vias have ring shapes formed along the side face of the penetrating electrode.

With this device, the contact area of the penetrating electrode with the via can be increased, so that the areas of the portions of the penetrating electrode electrically connected to the electrodes can be further increased. Therefore, degradation in the yield due to the imperfect contact between the penetrating electrode and the electrode can be prevented, and the contact resistance between the penetrating electrode and the electrode can be further reduced.

To accomplish the first and second objects, a semiconductor integrated circuit device according to a second aspect of the present invention is characterized in that the semiconductor integrated circuit device is made by stacking a plurality of semiconductor chips, and includes: a penetrating electrode formed to penetrate the plurality of semiconductor chips; a plurality of electrodes formed in respective layers constituting each of the plurality of semiconductor chips and having respective openings within which the penetrating electrode penetrates; and a plurality of vias each of which electrically connects electrodes of the plurality of electrodes located in adjacent layers. In this device, the plurality of electrodes are formed so that the opening of the electrode located in the upper layer has a greater diameter than the opening of the electrode located in the lower layer, and the penetrating electrode is in contact with at least one of portions of the top surfaces of the electrodes.

With the semiconductor integrated circuit device according to the second aspect of the present invention, the penetrating electrode can be brought into contact with portions of the top surfaces of the electrodes. In this device, the contact area of the penetrating electrode with the portion of the top surface of the electrode is far greater than the contact area of the penetrating electrode with the inner surface of the electrode.

Thus, the penetrating electrode has, as the points electrically connected to the electrodes, not the contact points with the inner surfaces of the electrodes but the contact points with the portions of the top surfaces of the electrodes. Thereby, the areas of the portions of the penetrating electrode electrically connected to the electrodes can be increased as compared with the case like the conventional example where the penetrating electrode is brought into contact with the inner surfaces of the electrodes. Therefore, degradation in the yield due to the imperfect contact between the penetrating electrode and the electrode can be prevented, and the contact resistance between the penetrating electrode and the electrode can be reduced.

Preferably, in the semiconductor integrated circuit device according to the second aspect of the present invention, the vias are each formed so that the side face thereof is in contact with the penetrating electrode.

With this device, the penetrating electrode can be brought into contact not only with the portion of the top surface of the electrode but also with the side face of the via.

Thus, the penetrating electrode has, as the points electrically connected to the electrodes, not only the contact points with the portions of the top surfaces of the electrodes but also the contact points with the side faces of the vias. Thereby, the areas of the portions of the penetrating electrode electrically connected to the electrodes can be further increased. Therefore, degradation in the yield due to the imperfect contact between the penetrating electrode and the electrode can be further prevented, and the contact resistance between the penetrating electrode and the electrode can be further reduced.

Preferably, in the semiconductor integrated circuit device according to the second aspect of the present invention, the vias have ring shapes formed along the side face of the penetrating electrode.

With this device, the contact area of the penetrating electrode with the via can be increased, so that the areas of the portions of the penetrating electrode electrically connected to the electrodes can be further increased. Therefore, degradation in the yield due to the imperfect contact between the penetrating electrode and the electrode can be prevented, and the contact resistance between the penetrating electrode and the electrode can be further reduced.

To accomplish the first object, a semiconductor integrated circuit device according to a third aspect of the present invention is characterized in that the semiconductor integrated circuit device is made by stacking a plurality of semiconductor chips, and includes: a penetrating electrode formed to penetrate a semiconductor substrate included in each of the plurality of semiconductor chips; a plurality of electrodes formed in respective layers constituting each of the plurality of semiconductor chips; and a plurality of vias each of which electrically connects electrodes of the plurality of electrodes located in adjacent layers. In this device, the penetrating electrode is electrically connected to a via of the plurality of vias which is formed in the bottommost one of the layers.

With the semiconductor integrated circuit device according to the third aspect of the present invention, the penetrating electrode penetrating only the semiconductor substrate is electrically connected to the via formed in the bottommost layer.

Thus, the penetrating electrode penetrating only the semiconductor substrate can be formed to secure a good filling with the material for the penetrating electrode as compared with the case like the conventional example where the penetrating electrode penetrating the layers and the semiconductor substrate is formed. Therefore, degradation in the yield due to the imperfect contact between the penetrating electrode and the electrode can be prevented.

Moreover, with the semiconductor integrated circuit device according to the third aspect of the present invention, the number of steps conducted in the formation process of the penetrating electrode can be reduced as compared with the case where the penetrating electrode penetrating the layers and the semiconductor substrate is formed. Therefore, the fabrication cost of the semiconductor integrated circuit device can be reduced.

Preferably, in the semiconductor integrated circuit device according to the first to third aspects of the present invention, at least one of the plurality of electrodes contained in the semiconductor chip is electrically connected to an internal circuit of the semiconductor chip.

Preferably, the semiconductor integrated circuit device according to the first to third aspects of the present invention further includes a shielding interconnect formed in the vicinity of the penetrating electrode and penetrating the layers to reach the surface of a semiconductor substrate included in each of the plurality of semiconductor chips.

With this device, the shielding interconnect is arranged in the vicinity of the penetrating electrode. Therefore, electromagnetic interference such as crosstalk from the internal circuit into the penetrating electrode can be eliminated.

Preferably, in the semiconductor integrated circuit device according to the first to third aspects of the present invention, the penetrating electrode is formed to penetrate an edge portion of the semiconductor chip, and the shielding interconnect is interposed between the penetrating electrode and the internal circuit of the semiconductor chip. Alternatively, preferably, the penetrating electrode is formed to penetrate a center portion of the semiconductor chip, and the shielding interconnect is formed to surround the penetrating electrode.

Thus, by controlling the shape of the shielding interconnect as appropriate according to the formation position of the penetrating electrode in the semiconductor chip, the shielding interconnect can be provided with an increase in the area of the semiconductor chip minimized.

Preferably, the semiconductor integrated circuit device according to the first to third aspects of the present invention further includes, in an intermediate semiconductor chip located intermediately in the plurality of semiconductor chips, an internal penetrating electrode formed to penetrate center portions of layers constituting the intermediate semiconductor chip, the penetrating electrode and the internal penetrating electrode are electrically connected through an interconnect layer formed in the intermediate semiconductor chip, and the penetrating electrode and the internal penetrating electrode are connected to a voltage supply source.

With this device, the internal penetrating electrode electrically connected to the voltage supply source can supply a voltage to the center portion of the intermediate semiconductor chip located intermediately in the plurality of semiconductor chips. Thus, stable voltage supply can be made to the center portion of the intermediate semiconductor chip without causing an unstable voltage supply thereto due to voltage drop as caused in the conventional technique.

In the semiconductor integrated circuit device according to the first to third aspects of the present invention, it is preferable to from the interconnect layer in a topmost layer of the layers.

Preferably, in the semiconductor integrated circuit device according to the first to third aspects of the present invention, the penetrating electrode includes: a first penetrating electrode formed to penetrate the plurality of semiconductor chips; and a second penetrating electrode formed to penetrate the plurality of semiconductor chips and differing from the first penetrating electrode, the internal penetrating electrode includes: a first internal penetrating electrode formed to penetrate center portions of the layers; and a second internal penetrating electrode formed to penetrate center portions of the layers and differing from the first internal penetrating electrode, the interconnect layer includes: a first interconnect layer; and a second interconnect layer formed on the first interconnect layer, the first penetrating electrode and the first internal penetrating electrode are electrically connected through one of the first interconnect layer and the second interconnect layer, the second penetrating electrode and the second internal penetrating electrode are electrically connected through the other interconnect layer, the first penetrating electrode and the first internal penetrating electrode are connected to a voltage supply source, and the second penetrating electrode and the second internal penetrating electrode are connected to another voltage supply source differing from the voltage supply source.

With this device, each of the first and second penetrating electrodes can supply a voltage to the center portion of the intermediate semiconductor chip. Therefore, efficient voltage supply can be made to the center portion of the intermediate semiconductor chip.

Moreover, with this device, for example, the first penetrating electrode is electrically connected to the voltage supply source supplying a first voltage, and the second penetrating electrode is electrically connected to the voltage supply source supplying a second voltage different from the first voltage. Thereby, the first and second voltages can be supplied to the center portion of the intermediate semiconductor chip, so that multiple voltages can be supplied to the center portion of the intermediate semiconductor chip.

To accomplish the first and second objects, a method for fabricating a semiconductor integrated circuit device according to a first aspect of the present invention is characterized in that the method includes: the step (a) of forming a plurality of electrodes in layers constituting a semiconductor chip, respectively, and forming a plurality of vias each of which electrically connects electrodes of the plurality of electrodes located in adjacent layers; the step (b) of forming a trench penetrating the layers to reach the inside of a semiconductor substrate included in the semiconductor chip, the trench being formed to expose the inner surfaces of the electrodes and the side faces of the vias; the step (c) of forming an insulating film on the side face of the semiconductor substrate making up the trench; the step (d) of forming, after the step (c), a penetrating electrode made of a conductive material filling the trench; the step (e) of polishing the bottom surface of the semiconductor substrate to expose the bottom surface of the penetrating electrode; and the step (f) of stacking the multiple semiconductor chips and electrically connecting the multiple penetrating electrodes to each other.

With the method for fabricating a semiconductor integrated circuit device according to the first aspect of the present invention, the penetrating electrode can be brought into contact not only with the inner surfaces of the electrodes but also with the side faces of the vias.

Thus, by bringing the penetrating electrode into contact not only with the inner surfaces of the electrodes but also with the side faces of the vias, the areas of the portions of the penetrating electrode electrically connected to the electrodes can be increased as compared with the case like the conventional example where the penetrating electrode is brought into contact only with the inner surfaces of the electrodes. Therefore, degradation in the yield due to the imperfect contact between the penetrating electrode and the electrode can be prevented, and the contact resistance between the penetrating electrode and the electrode can be reduced.

To accomplish the first and second objects, a method for fabricating a semiconductor integrated circuit device according to a second aspect of the present invention is characterized in that the method includes: the step (a) of forming a plurality of electrodes in layers constituting a semiconductor chip, respectively, and forming a plurality of vias each of which electrically connects electrodes of the plurality of electrodes located in adjacent layers; the step (b) of forming a trench penetrating the layers to reach the inside of a semiconductor substrate included in the semiconductor chip, the trench being formed to expose the inner surfaces of the electrodes and the side faces of the vias; the step (c) of forming an insulating film on the side face of the trench; the step (d) of forming, after the step (c), a penetrating electrode made of a conductive material filling the trench; the step (e) of polishing the bottom surface of the semiconductor substrate to expose the bottom surface of the penetrating electrode; and the step (f) of stacking the multiple semiconductor chips and electrically connecting the multiple penetrating electrodes to each other. In this method, the step of forming a plurality of electrodes in the step (a) is the step of forming the electrodes arranged so that they shift stepwise to expose portions of the top surfaces of the electrodes in the step (b).

With the method for fabricating a semiconductor integrated circuit device according to the second aspect of the present invention, the penetrating electrode can be brought into contact with portions of the top surfaces of the electrodes. In this device, the contact area of the penetrating electrode with the portion of the top surface of the electrode is far greater than the contact area of the penetrating electrode with the inner surface of the electrode.

Thus, by bringing the penetrating electrode into contact with the portions of the top surfaces of the electrodes, the areas of the portions of the penetrating electrode electrically connected to the electrodes can be increased as compared with the case like the conventional example where the penetrating electrode is brought into contact with the inner surfaces of the electrodes. Therefore, degradation in the yield due to the imperfect contact between the penetrating electrode and the electrode can be prevented, and the contact resistance between the penetrating electrode and the electrode can be reduced.

Preferably, in the method for fabricating a semiconductor integrated circuit device according to the second aspect of the present invention, the step (c) further comprises the step of removing portions of the insulating film existing on the side faces of the vias.

With this method, the penetrating electrode can be brought into contact not only with the portion of the top surface of the electrode but also with the side face of the via.

Thus, the penetrating electrode has, as the points electrically connected to the electrodes, not only the contact points with the portions of the top surfaces of the electrodes but also the contact points with the side faces of the vias. Thereby, the areas of the portions of the penetrating electrode electrically connected to the electrodes can be further increased. Therefore, degradation in the yield due to the imperfect contact between the penetrating electrode and the electrode can be further prevented, and the contact resistance between the penetrating electrode and the electrode can be further reduced.

To accomplish the first object, a method for fabricating a semiconductor integrated circuit device according to a third aspect of the present invention is characterized in that the method includes: the step (a) of forming a trench in a semiconductor substrate included in a semiconductor chip; the step (b) of forming an insulating film on the side face of the trench; the step (c) of forming, after the step (b), a penetrating electrode made of a conductive material filling the trench; the step (d) of forming a plurality of electrodes in layers constituting the semiconductor chip, respectively, and forming a plurality of vias each of which electrically connects electrodes of the plurality of electrodes located in adjacent layers; and the step (e) of polishing the bottom surface of the semiconductor substrate to expose the bottom surface of the penetrating electrode. In this method, the step of forming a plurality of vias in the step (d) is the step of forming the vias so that a via of the plurality of vias formed in the bottommost one of the layers is electrically connected to the penetrating electrode.

With the method for fabricating a semiconductor integrated circuit device according to the third aspect of the present invention, the penetrating electrode penetrating only the semiconductor substrate is electrically connected to the via formed in the bottommost layer.

Thus, the penetrating electrode penetrating only the semiconductor substrate can be formed to secure a good filling with the material for the penetrating electrode as compared with the case like the conventional example where the penetrating electrode penetrating the layers and the semiconductor substrate is formed. Therefore, degradation in the yield due to the imperfect contact between the penetrating electrode and the electrode can be prevented.

Moreover, with the method for fabricating a semiconductor integrated circuit device according to the third aspect of the present invention, the number of steps conducted in the formation process of the penetrating electrode can be reduced as compared with the case where the penetrating electrode penetrating the layers and the semiconductor substrate is formed. Therefore, the fabrication cost of the semiconductor integrated circuit device can be reduced.

Preferably, in the method for fabricating a semiconductor integrated circuit device according to the first to third aspects of the present invention, the step of forming a plurality of electrodes includes the step of forming a plurality of interconnects for shielding located in the vicinity of the plurality of electrodes, respectively, and the step of forming a plurality of vias includes: the step of forming a contact for shielding electrically connecting the semiconductor substrate and an interconnect of the plurality of interconnects for shielding formed in the bottommost one of the layers; and the step of forming a plurality of vias for shielding each of which electrically connects interconnects of the plurality of interconnects for shielding located in adjacent layers.

With this method, the shielding interconnect is arranged in the vicinity of the penetrating electrode. Therefore, electromagnetic interference such as crosstalk from the internal circuit into the penetrating electrode can be eliminated.

As described above, with the semiconductor integrated circuit device and its fabrication method according to the present invention, the penetrating electrode has, as the points electrically connected to the electrodes, not only the contact points with the inner surfaces of the electrodes but also the contact points with the side faces of the vias (or, not the contact points with the inner surfaces of the electrodes but the contact points with the portions of the top surfaces of the electrodes). Thereby, the areas of the portions of the penetrating electrode electrically connected to the electrodes can be increased as compared with the case like the conventional example where the penetrating electrode is brought into contact with the inner surfaces of the electrodes. Therefore, degradation in the yield due to the imperfect contact between the penetrating electrode and the electrode can be prevented, and the contact resistance between the penetrating electrode and the electrode can be reduced.

BRIEF DESCRIPTION OF THE DRAWINGS

FIGS. 3A and 3B are schematic top views showing the structure of a semiconductor integrated circuit device according to a third embodiment of the present invention.

FIGS. 7A to 7D are sectional views showing main process steps of the method for fabricating a semiconductor integrated circuit device according to the fifth embodiment of the present invention.

FIGS. 9A to 9D are sectional views showing main process steps of a method for fabricating a semiconductor integrated circuit device according to the sixth embodiment of the present invention.

DETAILED DESCRIPTION OF THE PREFERRED EMBODIMENTS

Embodiments of the present invention will now be described below with reference to the accompanying drawings.

First Embodiment

Figure 1:
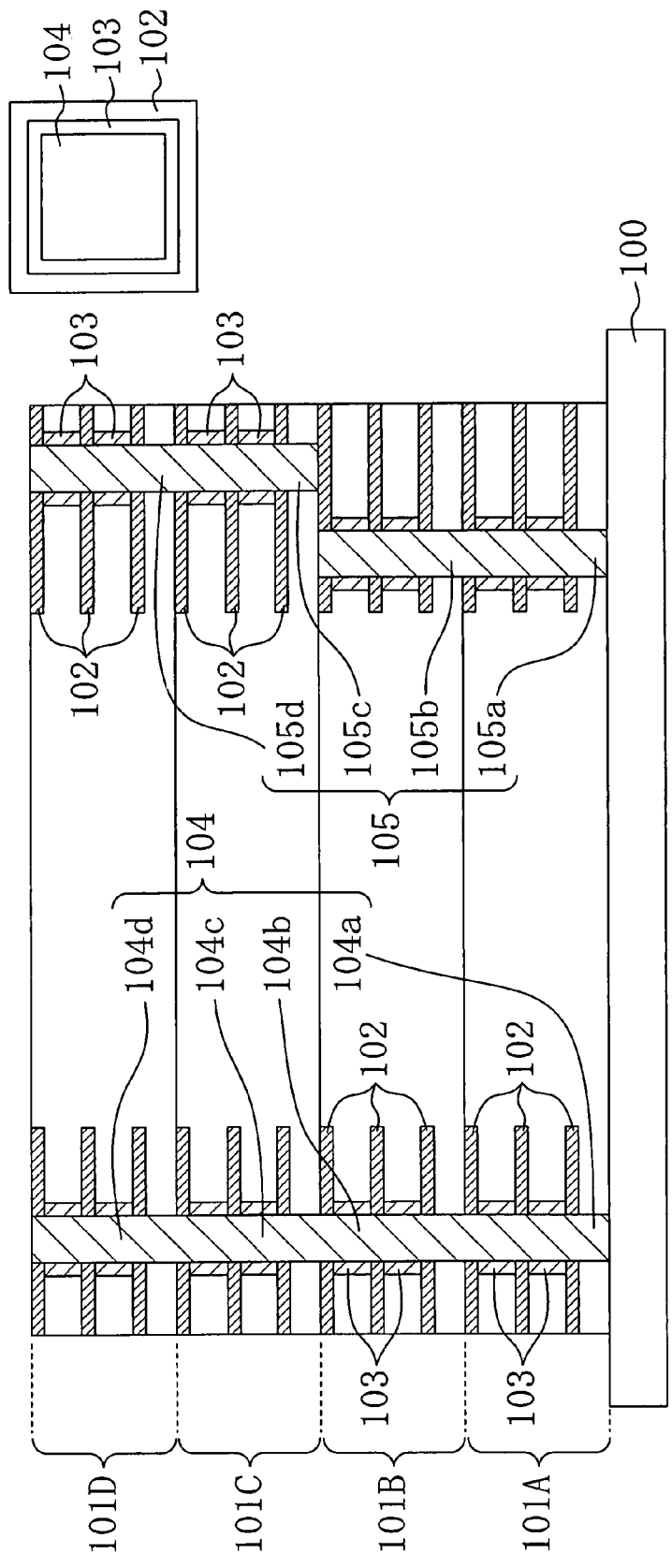
FIG. 1A is a schematic cross-sectional view showing the structure of a semiconductor integrated circuit device according to a first embodiment of the present invention.
FIG. 1B is an enlarged top view showing the structure of an interelectrode connection via.

A semiconductor integrated circuit device according to a first embodiment of the present invention will be described below with reference to FIGS. 1A and 1B. FIG. 1A is a schematic cross-sectional view showing the structure of the semiconductor integrated circuit device according to the first embodiment of the present invention, and FIG. 1B is an enlarged top view showing the structure of a via for interelectrode connection (an interelectrode connection via).

Referring to FIG. 1A, on a semiconductor package 100, semiconductor chips 101A, 101B, 101C, and 101D are sequentially stacked from bottom to top. Layers constituting each of the semiconductor chips 101A, 101B, 101C, and 101D (not shown in detail) are formed with electrodes 102, respectively, and the multiple electrodes 102 contained in the semiconductor chips 101A, 101B, 101C, and 101D are arranged to be stacked vertically. Each of the layers is formed with a ring-shaped interelectrode connection via 103 electrically connecting electrodes of the multiple electrodes 102 which are provided in adjacent layers.

The semiconductor integrated circuit device according to the first embodiment is constructed in the manner in which penetrating electrodes 104 and 105 penetrating the semiconductor chips 101A to 101D connect the electrodes 102 of the semiconductor chips 101A to 101D to the semiconductor package 100 to stack the semiconductor chips 101A to 101D on the semiconductor package 100.

In this structure, as shown in FIG. 1A, the penetrating electrode 104 includes penetrating electrodes 104a, 104b, 104c, and 104d penetrating the semiconductor chips 101A, 101B, 101C, and 101D, respectively, and is constructed by electrically connecting the penetrating electrodes 104a to 104d. Also, as shown in FIG. 1A, the penetrating electrode 105 includes penetrating electrodes 105a, 105b, 105c, and 105d penetrating the semiconductor chips 101A, 101B, 101C, and 101D, respectively, and is constructed by electrically connecting the penetrating electrodes 105a to 105d.

As shown in FIG. 1B, each of the interelectrode connection vias 103 has a ring shape formed along the side face of the penetrating electrode 104 penetrating the electrodes 102, and is formed so that the side face thereof comes into contact with the penetrating electrode 104.

In this structure, out of the multiple electrodes 102 contained in each of the semiconductor chips 101A to 101D, the electrode 102 formed in the bottommost one of the layers constituting the chip is electrically connected to an internal circuit of each said chip of the semiconductor chips 101A to 101D. Thus, in the first embodiment, out of the multiple electrodes contained in each of the semiconductor chips, the electrode formed in the bottommost one of the layers constituting the chip is, in other words, "an interconnect electrically connected to an internal circuit of the semiconductor chip", while all the electrodes but the electrode formed in the bottommost layer are interconnects electrically connected through the interelectrode connection vias to "the interconnect electrically connected to the internal circuit of the semiconductor chip."

With the semiconductor integrated circuit device according to the first embodiment, the penetrating electrodes 104 and 105 are in contact not only with the inner surfaces of the electrodes 102 but also with the inner surfaces of the interelectrode connection vias 103. Thus, even though a malfunction in formation (for example, a malfunction in formation such as inadequate filling with the material for the penetrating electrode or creation of voids) of the penetrating electrodes 104 and 105 (in particular, the points of the penetrating electrodes 104 and 105 in contact with the electrodes 102) causes an imperfect contact between the penetrating electrodes 104 and 105 and the electrodes 102, degradation in the yield due to the imperfect contact therebetween can be prevented because the penetrating electrodes 104 and 105 are in contact with the interelectrode connection vias 103.

Moreover, with the semiconductor integrated circuit device according to the first embodiment, the penetrating electrodes 104 and 105 are in contact not only with the inner surfaces of the electrodes 102 but also with the inner surfaces of the interelectrode connection vias 103. Thus, the points of the penetrating electrodes 104 and 105 electrically connected to the electrodes 102 are not only the portions thereof in contact with the inner surfaces of the electrodes 102 but also the portions thereof in contact with the inner surfaces of the interelectrode connection vias 103, so that the areas of the portions of the penetrating electrodes 104 and 105 electrically connected to the electrodes 102 can be increased. This provides a reduced contact resistance between the penetrating electrode and the electrode.

As described above, the conventional structure is constructed so that the points of the penetrating electrode electrically connected to the electrodes are only the points thereof in contact with the inner surfaces of the electrodes, while the structure of the first embodiment is constructed so that the electrical connection points of the penetrating electrode are not only the points thereof in contact with the inner surfaces of the electrodes but also the points thereof in contact with the inner surfaces of the interelectrode connection vias. With this structure, the areas of the portions of the penetrating electrode electrically connected to the electrodes can be increased. Therefore, degradation in the yield due to the imperfect contact between the penetrating electrode and the electrode can be prevented, and the contact resistance between the penetrating electrode and the electrode can be reduced.

Second Embodiment

Figure 2:
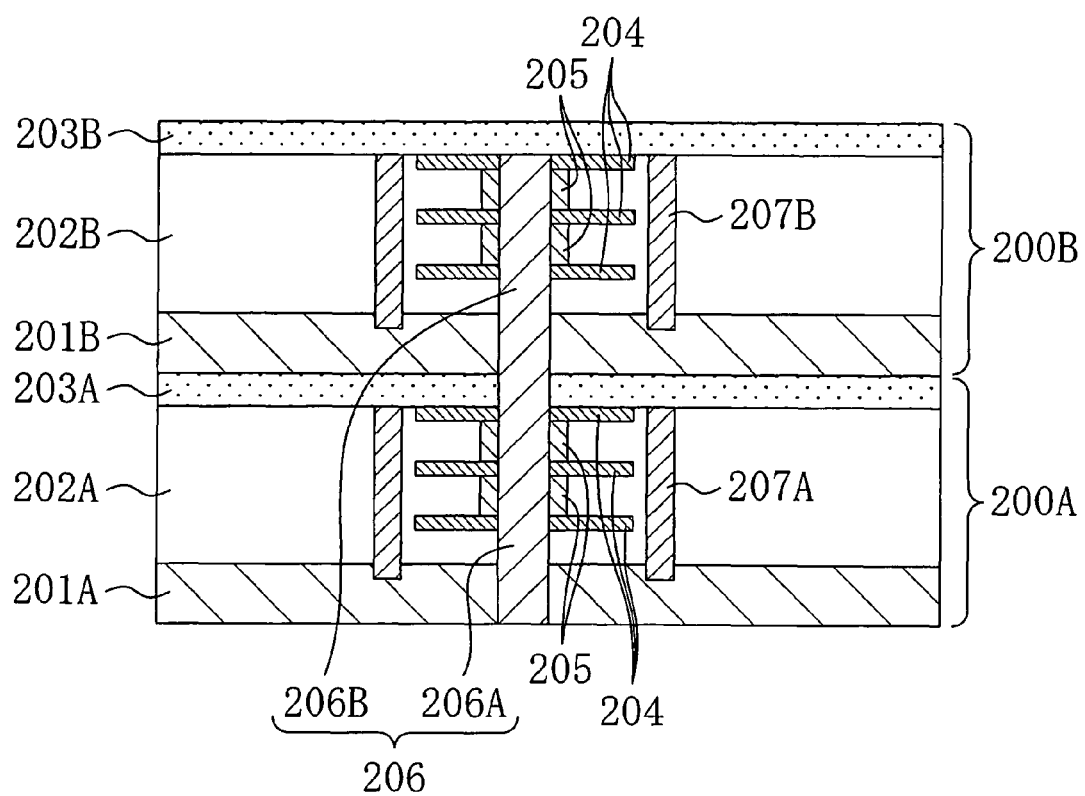
FIG. 2 is a schematic cross-sectional view showing the structure of a semiconductor integrated circuit device according to a second embodiment of the present invention.

A semiconductor integrated circuit device according to a second embodiment of the present invention will be described below with reference to FIG. 2. FIG. 2 is a schematic cross-sectional view showing the structure of the semiconductor integrated circuit device according to the second embodiment of the present invention.

Referring to FIG. 2, semiconductor chips 200A and 200B include semiconductor substrates 201A and 201B, regions 202A and 202B formed with interconnects and elements, and insulating films 203A and 203B, respectively. Layers (not shown in detail) contained in the regions 202A and 202B formed with interconnects and elements are provided with electrodes 204, respectively, and the multiple electrodes 204 contained in the semiconductor chips 200A and 200B are arranged to be stacked vertically. Each of the layers is formed with an interelectrode connection via 205 electrically connecting electrodes of the multiple electrodes 204 which are provided in adjacent layers.

The semiconductor integrated circuit device according to the second embodiment is constructed in the manner in which a penetrating electrode 206 penetrating the semiconductor chips 200A and 200B connects the electrodes 204 of the semiconductor chips 200A and 200B to a semiconductor package (not shown) to stack the semiconductor chips 200A and 200B on the semiconductor package. In this structure, as shown in FIG. 2, the penetrating electrode 206 includes penetrating electrodes 206A and 206B penetrating the semiconductor chips 200A and 200B, respectively, and is constructed by electrically connecting the penetrating electrodes 206A and 206B.

Each of the interelectrode connection vias 205 has a ring shape formed along the side face of the penetrating electrode 206, and is formed so that the side face thereof comes into contact with the penetrating electrode 206.

In this structure, out of the multiple electrodes 204 contained in each of the semiconductor chips 200A and 200B, the electrode formed in the bottommost one of the layers constituting the chip is electrically connected to an internal circuit of each said chip of the semiconductor chips 200A and 200B. On the other hand, all the electrodes but the electrode formed in the bottommost layer is electrically connected through the interelectrode connection vias 205 to the electrode electrically connected to the internal circuit of the semiconductor chip.

The second embodiment differs from the first embodiment described above in the following point.

The point of difference is that the semiconductor integrated circuit device according to the second embodiment is provided with shielding interconnects 207A and 207B surrounding the penetrating electrodes 206A and 206B in order to eliminate electromagnetic interference, such as crosstalk, into the penetrating electrode. To be more specific, as shown in FIG. 2, the shielding interconnects 207A and 207B in ring shapes penetrate the layers of the regions 202A and 202B formed with interconnects and elements, and reach the insides of the semiconductor substrates 201A and 201B, respectively. The shielding interconnects 207A and 207B having this structure are arranged to surround the penetrating electrodes 206A and 206B.

In the semiconductor integrated circuit device according to the second embodiment, the shielding interconnects 207A and 207B are arranged to surround the penetrating electrodes 206A and 206B penetrating the semiconductor chips 200A and 200B, respectively, which enables elimination of electromagnetic interference such as crosstalk from a penetrating electrode (not shown) adjoining the penetrating electrode 206 into the penetrating electrode 206 and crosstalk from interconnects and elements located in the regions 202A and 202B formed with the interconnects and elements into the penetrating electrode 206.

Moreover, in the semiconductor integrated circuit device according to the second embodiment, like the first embodiment described above, the penetrating electrode 206 is in contact not only with the inner surfaces of the electrodes 204 but also with the inner surfaces of the interelectrode connection vias 205. Thus, the penetrating electrode 206 has, as the points thereof electrically connected to the electrodes 204, not only the portions thereof in contact with the inner surfaces of the electrodes 204 but also the portions thereof in contact with the inner surfaces of the interelectrode connection vias 205, so that the areas of the portions of the penetrating electrode 206 electrically connected to the electrodes 204 can be increased. Therefore, degradation in the yield due to the imperfect contact between the penetrating electrode 206 and the electrode 204 can be prevented, and the contact resistance between the penetrating electrode 206 and the electrode 204 can be reduced.

In the second embodiment, in practice, the thicknesses of the semiconductor substrates 201A and 201B are far greater than those of the regions 202A and 202B formed with interconnects and elements and those of the insulating films 203A and 203B. However, for brevity of illustration, FIG. 2 shows these components so that the thicknesses of the semiconductor substrates 201A and 201B have a greater reduction ratio than the thicknesses of the regions 202A and 202B formed with interconnects and elements and the thicknesses of the insulating films 203A and 203B. Such an illustration is also employed by embodiments that follow.

Third Embodiment

A semiconductor integrated circuit device according to a third embodiment of the present invention will be described below with reference to FIGS. 3A and 3B. FIGS. 3A and 3B are schematic top views showing the structure of the semiconductor integrated circuit device according to the third embodiment of the present invention.

As shown in FIG. 3A, in the case where a penetrating electrode 304A is formed in an edge portion of a semiconductor chip 300A, a single-sided shielding interconnect 305 is provided along the surface at which the penetrating electrode 304A faces an internal circuit located in an internal circuit region 301A thereof. Also, the single-sided shielding interconnect 305 is provided to be interposed between the internal circuit of the semiconductor chip and the penetrating electrode 304A.

On the other hand, as shown in FIG. 3B, in the case where a penetrating electrode 304B is formed in a center portion of a semiconductor chip 300B, an all-sided shielding interconnect 306 surrounding the penetrating electrode 304B is provided to be interposed between the penetrating electrode 304B and an internal circuit located in an internal circuit region 301B of the semiconductor chip.

In this structure, as shown in FIGS. 3A and 3B, interelectrode connection vias 303A and 303B have ring shapes formed along the side face of the penetrating electrodes 304A and 3041 penetrating electrodes 302A and 302B, respectively, like the first embodiment, and are formed so that the side faces thereof come into contact with the penetrating electrodes 304A and 304B, respectively.

In the semiconductor integrated circuit device according to the third embodiment, the single-sided shielding interconnect 305 or the all-sided shielding interconnect 306 is selectively provided as appropriate according to the formation positions of the penetrating electrodes 304A and 304B in the semiconductor chip, whereby the shielding interconnect can be provided with an increase in the area of the semiconductor chip minimized.

Moreover, in the semiconductor integrated circuit device according to the third embodiment, as shown in FIGS. 3A and 3B, the shielding interconnects 305 and 306 are provided to be interposed between the penetrating electrodes 304A and 304B and the internal circuits of the semiconductor chip, respectively, which enables, like the second embodiment described above, elimination of electromagnetic interference such as crosstalk from interconnects and elements located in regions formed with the interconnects and elements into the penetrating electrodes 304A and 304B and crosstalk from penetrating electrodes (not shown) adjoining the penetrating electrodes 304A and 304B into the penetrating electrodes 304A and 304B.

Furthermore, in the semiconductor integrated circuit device according to the third embodiment, like the first and second embodiments described above, the penetrating electrodes 304A and 304B are in contact not only with the inner surfaces of the electrodes 302A and 302B but also with the inner surfaces of the interelectrode connection vias 303A and 303B. Thus, the penetrating electrodes 304A and 304B have, as the points electrically connected to the electrodes 302A and 302B, not only the portions thereof in contact with the inner surfaces of the electrodes 302A and 302B but also the portions thereof in contact with the inner surfaces of the interelectrode connection vias 303A and 303B, so that the areas of the portions of the penetrating electrodes 304A and 304B electrically connected to the electrodes 302A and 302B can be increased. Therefore, degradation in the yield due to the imperfect contact between the penetrating electrode and the electrode can be prevented, and the contact resistance between the penetrating electrode and the electrode can be reduced.

Fourth Embodiment

Figure 4:
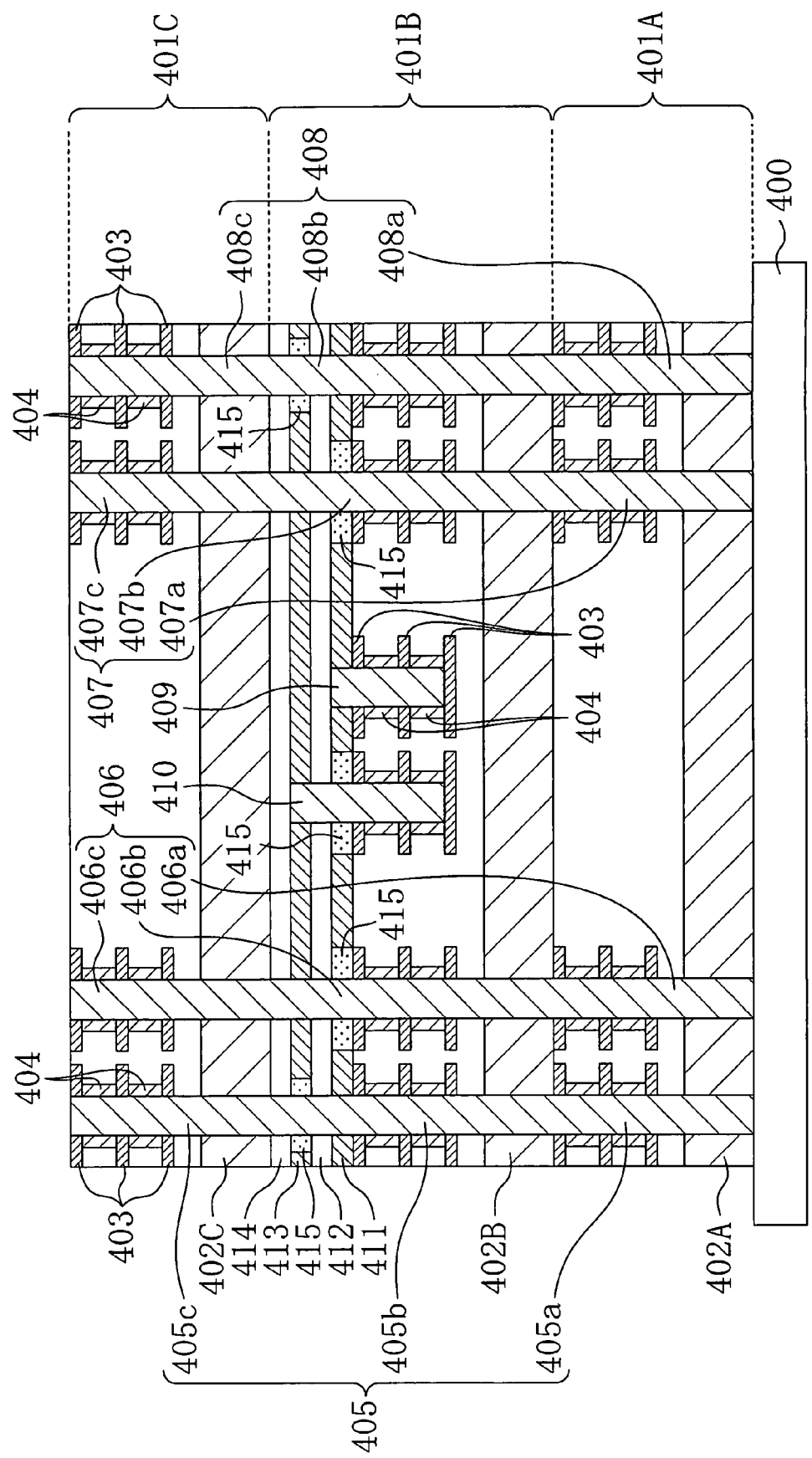
FIG. 4 is a schematic cross-sectional view showing the structure of a semiconductor integrated circuit device according to a fourth embodiment of the present invention.

A semiconductor integrated circuit device according to a fourth embodiment of the present invention will be described below with reference to FIG. 4. FIG. 4 is a schematic cross-sectional view showing the structure of the semiconductor integrated circuit device according to the fourth embodiment of the present invention.

Referring to FIG. 4, on a semiconductor package 400, semiconductor chips 401A, 401B, and 401C are sequentially stacked from bottom to top. The semiconductor chips 401A, 401B, and 401C have semiconductor substrates 402A, 402B, and 402C, respectively, and layers (not shown in detail) formed on each of the semiconductor substrates 402A, 402B, and 402C are formed with electrodes 403, respectively. The multiple electrodes 403 contained in the semiconductor chips 401A, 401B, and 401C are arranged to be stacked vertically as shown in FIG. 4. Each of the layers is formed with an interelectrode connection via 404 electrically connecting electrodes of the multiple electrodes 403 which are provided in adjacent layers.

The semiconductor integrated circuit device according to the fourth embodiment is constructed in the manner in which penetrating electrodes 405, 406, 407, and 408 penetrating the semiconductor chips 401A to 401C connect the electrodes 403 of the semiconductor chips 401A to 401C to the semiconductor package 400 to stack the semiconductor chips 401A to 401C on the semiconductor package 400.

In this structure, the penetrating electrode 405 is constructed so that a penetrating electrode 405a of the semiconductor chip 401A, a penetrating electrode 405b of the semiconductor chip 401B, and a penetrating electrode 405c of the semiconductor chip 401C are sequentially stacked from bottom to top. Likewise, the penetrating electrode 406 is constructed so that a penetrating electrode 406a of the semiconductor chip 401A, a penetrating electrode 406b of the semiconductor chip 401B, and a penetrating electrode 406c of the semiconductor chip 401C are sequentially stacked from bottom to top. Likewise, the penetrating electrode 407 is constructed so that a penetrating electrode 407a of the semiconductor chip 401A, a penetrating electrode 407b of the semiconductor chip 401B, and a penetrating electrode 407c of the semiconductor chip 401C are sequentially stacked from bottom to top. Likewise, the penetrating electrode 408 is constructed so that a penetrating electrode 408a of the semiconductor chip 401A, a penetrating electrode 408b of the semiconductor chip 401B, and a penetrating electrode 408c of the semiconductor chip 401C are sequentially stacked from bottom to top.

The fourth embodiment differs from the first to third embodiments described above in the following point.

The point of difference is that as shown in FIG. 4, in the semiconductor integrated circuit device according to the fourth embodiment, internal penetrating electrodes 409 and 410 penetrating the center portions of the layers constituting the semiconductor chip 401B are provided in the intermediately located semiconductor chip 401B (intermediate semiconductor chip) out of the semiconductor chips 401A and 401C.

As shown in FIG. 4, a first interconnect film 411, a first insulating film 412, a second interconnect film 413, and a second insulating film 414 are sequentially formed on the surface of the semiconductor chip 401B. Further, an insulating film 415 is formed between the first interconnect film 411 and the internal penetrating electrode 410, between the first interconnect film 411 and the penetrating electrode 406, and between the first interconnect film 411 and the penetrating electrode 407. On the other hand, the insulating film 415 is also formed between the second interconnect film 413 and the penetrating electrode 405, and between the second interconnect film 413 and the penetrating electrode 408.

As shown in FIG. 4, the internal penetrating electrode 410 penetrates the second interconnect film 413, the first insulating film 412, the insulating film 415, and the center portions of the layers to make connection at its bottom end to the top surface of the electrode 403 formed in the bottommost one of the layers. On the other hand, the internal penetrating electrode 409 penetrates the first interconnect film 411 and the center portions of the layers to make connection at its bottom end to the top surface of the electrode 403 formed in the bottommost one of the layers.

In the manner described above, the internal penetrating electrode 410 is electrically connected through the second interconnect film 413 to the penetrating electrode 406 and the penetrating electrode 407, while the internal penetrating electrode 409 is electrically connected through the first interconnect film 411 to the penetrating electrode 405 and the penetrating electrode 408.

In addition, as shown in FIG. 4, the interelectrode connection via 404 has a ring shape formed along the side face of the penetrating electrode or the internal penetrating electrode, and is formed so that the side face thereof comes into contact with the penetrating electrode or the internal penetrating electrode.

Voltage supply to the semiconductor integrated circuit device according to the fourth embodiment will be described below.

Voltage supply to the semiconductor chip 401A, the semiconductor chip 401B, and the semiconductor chip 401C is conducted by the penetrating electrodes 405, 406, 407, and 408. To be more specific, for example, a voltage (for example, a first voltage) is supplied to the semiconductor chips 401A to 401C by the penetrating electrodes 405 and 408 electrically connected to a first voltage supply source (not shown) for supplying the first voltage. On the other hand, for example, a voltage (for example, a second voltage) is supplied to the semiconductor chips 401A to 401C by the penetrating electrodes 406 and 407 electrically connected to a second voltage supply source (not shown) for supplying the second voltage different from the first voltage.

Voltage supply to the center portion of the semiconductor chip 401B is conducted by the internal penetrating electrodes 409 and 410. To be more specific, a voltage (for example, the second voltage) is supplied to the center portion of the semiconductor chip 401B by the internal penetrating electrode 410 electrically connected through the second interconnect film 413 to the penetrating electrodes 406 and 407. On the other hand, a voltage (for example, the first voltage) is supplied to the center portion of the semiconductor chip 401B by the internal penetrating electrode 409 electrically connected through the first interconnect film 411 to the penetrating electrodes 405 and 408.

As described above, in the fourth embodiment, the internal penetrating electrode 409 and the internal penetrating electrode 410 can supply a voltage efficiently to the center portion of the semiconductor chip 401B located intermediately. Moreover, the internal penetrating electrode 409 electrically connected to the first voltage supply source can supply the first voltage to the center portion of the semiconductor chip 401B, and also the internal penetrating electrode 410 electrically connected to the second voltage supply source can supply the second voltage different from the first voltage to the center portion of the semiconductor chip 401B.

With the semiconductor integrated circuit device according to the fourth embodiment, the internal penetrating electrodes 409 and 410 supply voltage to the center portion of the semiconductor chip 401B located intermediately. Therefore, a voltage can be supplied stably to the center portion of the semiconductor chip 401B located intermediately without causing an unstable voltage supply thereto due to voltage drop as caused in the conventional technique.

Moreover, in the semiconductor integrated circuit device according to the fourth embodiment, if a plurality of voltage supply sources (not shown) are present, the internal penetrating electrodes 409 and 410 corresponding in number with the voltage supply sources are provided, the interconnect layers 411 and 413 are staked in a multilayer structure according to the number of internal penetrating electrodes 409 and 410, and the internal penetrating electrodes 409 and 410 are electrically connected to the voltage supply sources (not shown). Thereby, each of the voltage supply sources can be employed exclusively for the corresponding one of the internal penetrating electrodes 409 and 410, so that efficient voltage supply can be made to the center portion of the semiconductor chip 401B.

Furthermore, the internal penetrating electrode 409 is electrically connected to the first voltage supply source for supplying the first voltage, and the internal penetrating electrode 410 is electrically connected to the second voltage supply source for supplying the second voltage different from the first voltage. Thereby, the first and second voltages can be supplied to the center portion of the semiconductor chip 401B, so that multiple voltages can be supplied to the center portion of the semiconductor chip 401B.

With the semiconductor integrated circuit device according to the fourth embodiment, like the first to third embodiments, the penetrating electrodes 405, 406, 407, and 408 are in contact not only with the inner surfaces of the electrodes 403 but also the inner surfaces of the interelectrode connection vias 404. Thus, the points of the penetrating electrodes 405, 406, 407, and 408 electrically connected to the electrodes 403 are not only the portions thereof in contact with the inner surfaces of the electrodes 403 but also the portions thereof in contact with the inner surfaces of the interelectrode connection vias 404, so that the areas of the portions of the penetrating electrodes 405, 406, 407, and 408 electrically connected to the electrodes 403 can be increased. Therefore, degradation in the yield due to the imperfect contact between the penetrating electrode and the electrode can be prevented, and the contact resistance between the penetrating electrode and the electrode can be reduced.

In the fourth embodiment of the present invention, the first interconnect film 411 formed in the intermediate semiconductor chip and the second interconnect film 413 as a topmost layer formed on the first interconnect film 411 with the first insulating film 412 interposed are described as interconnect films electrically connecting the penetrating electrode and the internal penetrating electrode, as shown in FIG. 4. The present invention, however, is not limited thereto and requires formation of the interconnect films (interconnect layers) only in any of the layers of the semiconductor chip (intermediate semiconductor chip) 401B.

The formation of the interconnect layers in the intermediate semiconductor chip includes, in addition to formation thereof in the topmost layer of the plurality of stacked layers (see FIG. 4), formation thereof between any adjacent layers.

Though the first interconnect film 411 is arranged under the second interconnect film 413 in the fourth embodiment of the present invention, the reverse positional relationship, namely, an arrangement in which the first interconnect film 411 is arranged above the second interconnect film 413 may be employable, of course.

Fifth Embodiment

A method for fabricating a semiconductor integrated circuit device according to a fifth embodiment of the present invention will be described below with reference to FIGS. 6A to 6D and 7A to 7D. FIGS. 6A to 6D and 7A to 7D are sectional views showing main process steps of the method for fabricating a semiconductor integrated circuit device according to the fifth embodiment of the present invention.

Figure 5:
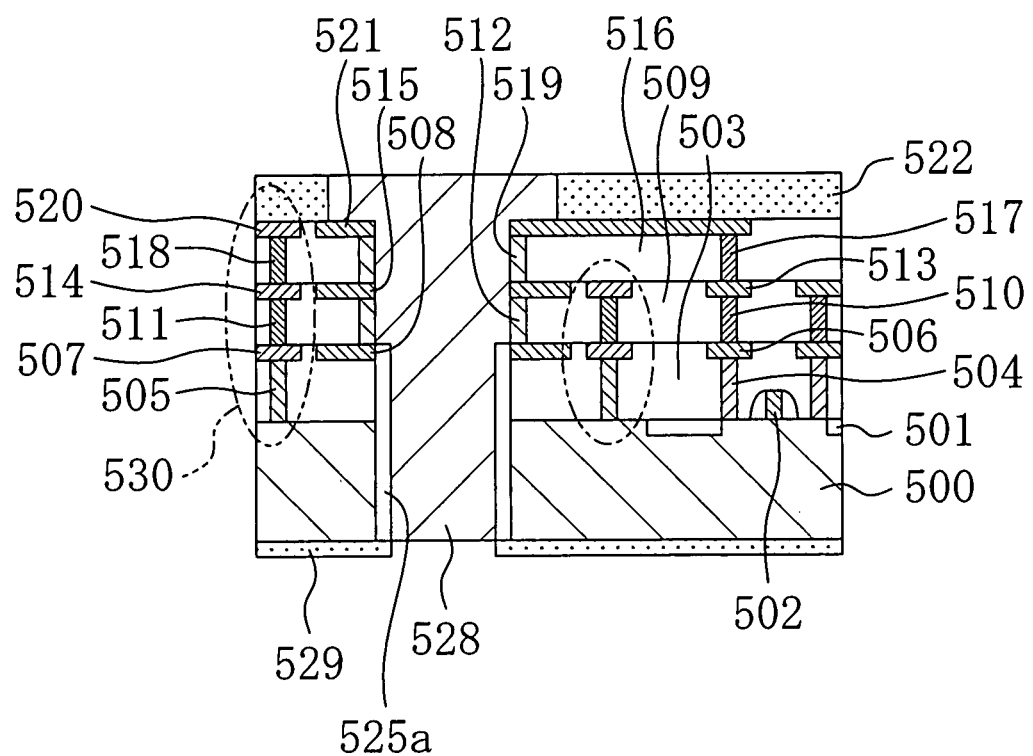
FIG. 5 is a sectional view showing the structure of a semiconductor chip constituting a semiconductor integrated circuit device according to a fifth embodiment of the present invention.

A characteristic point of the fifth embodiment is that in order to accomplish the first object (prevention of degradation in yield) and the second object (reduction in contact resistance), a penetrating electrode is brought into contact with the side face of an interelectrode connection via as in the cases of the first to fourth embodiments. FIG. 5 is a sectional view showing the structure of a semiconductor chip constituting the semiconductor integrated circuit device according to the fifth embodiment of the present invention. As shown in FIG. 5, a penetrating electrode 528 is in contact not only with the side faces of second and third electrodes 515 and 521 but also the side faces of first and second interelectrode connection vias 512 and 519.

Figure 6A:
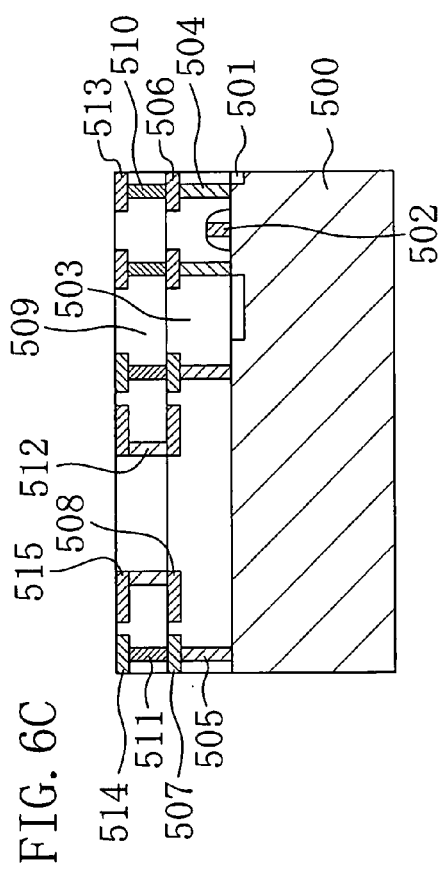
FIGS. 6A to 6D are sectional views showing main process steps of a method for fabricating a semiconductor integrated circuit device according to the fifth embodiment of the present invention.

As shown in FIG. 6A, first, by a known fabrication method of a semiconductor integrated circuit device, an isolation film 501 is formed in the surface of a silicon substrate 500, and an element such as a transistor 502 is formed in an active region of the silicon substrate 500 surrounded with the isolation film 501. Subsequently, on the silicon substrate 500, a first interlayer insulating film 503 is deposited to cover the transistor 502.

Figure 6C:
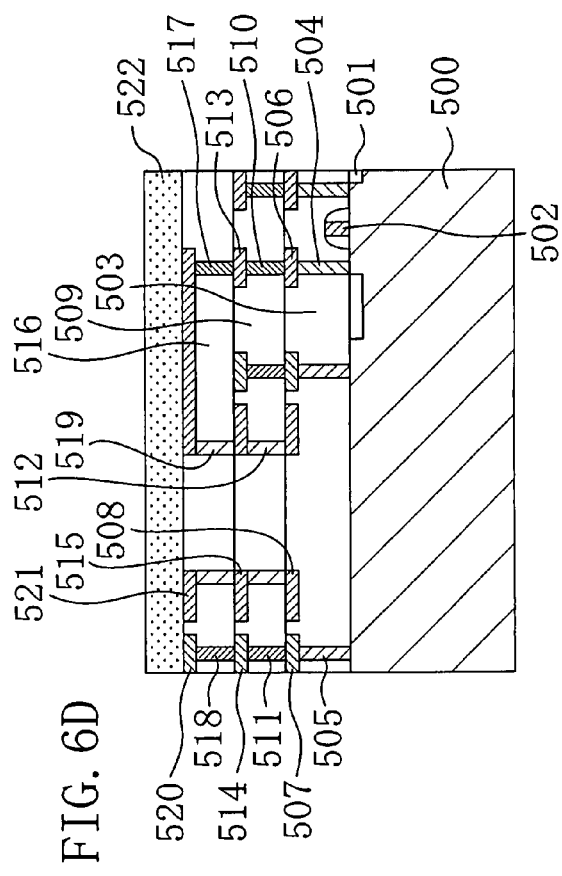
Figure 6B:
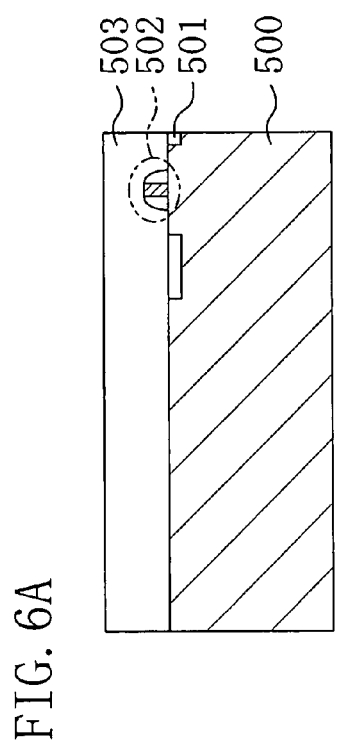

Next, as shown in FIG. 6B, by a lithography and a dry etching, the first interlayer insulating film 503 is formed with: a ring-shaped contact hole for element connection reaching the active region of the silicon substrate 500; and a ring-shaped contact hole for a shielding interconnect reaching the silicon substrate 500. Subsequently, the inside of the contact hole for element connection and the inside of the contact hole for a shielding interconnect are filled with a conductive material to form a ring-shaped contact 504 for element connection and a ring-shaped contact 505 for a shielding interconnect. Then, by a lithography and a dry etching, the first interlayer insulating film 503 is formed with: a ring-shaped first element interconnect recess which reaches the top end of the contact 504 for element connection; a ring-shaped first interconnect recess for a shielding interconnect which reaches the top end of the contact 505 for a shielding interconnect; and a ring-shaped recess for a first electrode which has an opening on the inner side of the opening of the ring-shaped first interconnect recess for a shielding interconnect. The inside of the first element interconnect recess, the inside of the first interconnect recess for a shielding interconnect; and the inside of the recess for a first electrode are filled with a conductive material to form: a ring-shaped first element interconnect 506 connected at its bottom surface to the top end of the contact 504 for element connection; a ring-shaped first interconnect 507 for a shielding interconnect connected at its bottom surface to the top end of the contact 505 for a shielding interconnect; and a ring-shaped first electrode 508.

As shown in FIG. 6C, a second interlayer insulating film 509 is deposited on the first interlayer insulating film 503. Then, by a lithography and a dry etching, the second interlayer insulating film 509 is formed with: a ring-shaped first via hole for making connection between element interconnects, which reaches the top surface of the first element interconnect 506; a ring-shaped first via hole for a shielding interconnect, which reaches the top surface of the first interconnect 507 for a shielding interconnect; and a ring-shaped first via hole for making connection between electrodes, which reaches the top surface of the first interconnect 508. Subsequently, by a lithography and a dry etching, the second interlayer insulating film 509 is formed with: a ring-shaped second element interconnect recess communicated with the first via hole for making connection between element interconnects; a ring-shaped second interconnect recess for a shielding interconnect communicated with the first via hole for a shielding interconnect; and a ring-shaped recess for a second electrode communicated with the first via hole for making connection between electrodes.

Subsequently, the inside of the first via hole for making connection between element interconnects and the second element interconnect recess, the inside of the first via hole and the second interconnect recess for a shielding interconnect, and the inside of the first via hole for making connection between electrodes and the recess for a second electrode are filled with a conductive material to form: a ring-shaped second element interconnect 513 connected at its bottom surface to the top end of a ring-shaped first via 510 for making connection to element interconnects; a ring-shaped second interconnect 514 for a shielding interconnect connected at its bottom surface to the top end of a ring-shaped first via 511 for a shielding interconnect; and a ring-shaped second electrode 515 connected at its bottom surface to the top end of a ring-shaped first via 512 for making connection between electrodes.

Figure 6D:
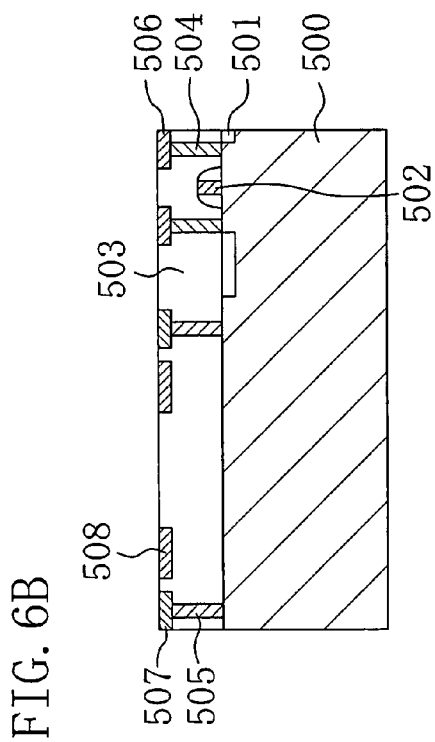

For brevity of description, in the fabrication method of the fifth embodiment, a formation step of an interconnect layer serving as the topmost layer is conducted in the next step shown in FIG. 6D. However, in the actual fabrication method, the step shown in FIG. 6C may be repeatedly conducted to form a multilayer interconnection substrate in which a greater number of interconnect layers are multilayered.

Next, as shown in FIG. 6D, a third interlayer insulating film 516 is formed on the second interlayer insulating film 509. By a lithography and a dry etching, the third interlayer insulating film 516 is formed with: a C-shaped second via hole for making connection between element interconnects, which reaches the top surface of the second element interconnect 513; a C-shaped second via hole for a shielding interconnect, which reaches the top surface of the second interconnect 514 for a shielding interconnect; and a ring-shaped second via hole for making connection between electrodes, which reaches the top surface of the second electrode 515. Subsequently, by a lithography and a dry etching, the third interlayer insulating film 516 is formed with: a C-shaped third interconnect recess for a shielding interconnect communicated with the second via hole for a shielding interconnect;

and a ring-shaped recess for a third electrode communicated with the second via hole for making connection between element interconnects and the second via hole for making connection between electrodes. The inside of the second via hole for making connection between element interconnects, the inside of the second via hole and the third interconnect recess for a shielding interconnect, and the inside of the second via hole for making connection between electrodes and the recess for a third electrode are filled with a conductive material to form: a C-shaped third interconnect 520 for a shielding interconnect connected at its bottom surface to the top end of a C-shaped second via 518 for a shielding interconnect; and a ring-shaped third electrode 521 connected at its bottom surface to the top end of a C-shaped second via 517 for making connection between element interconnects and to the top end of a ring-shaped second via 519 for making connection between electrodes. Then, for example, a first insulating film 522 made of a nitride film is deposited on the third interlayer insulating film 516.

In this structure, as shown in FIG. 6D, the third electrode 521 is connected at its bottom surface to the top end of the second via 517 for making connection between element interconnects, and out of the first interconnect 508, the second electrode 515, and the third electrode 521, the third electrode 521 formed in the third interlayer insulating film 516 as the topmost layer is electrically connected to an internal circuit.

Also, in this structure, as shown in FIG. 6D, in the third interlayer insulating film 516 formed with the third electrode 521 electrically connected to the internal circuit such as an element, the second via 518 and the third interconnect 520 for a shielding interconnect provided therein is formed to have not a ring shape but a C-shape. Thus, it is necessary to control the shapes of the via and the interconnect for a shielding interconnect in order not to bring the electrode electrically connected to the internal circuit into contact with the via and the interconnect for a shielding interconnect.

Subsequently, as shown in FIG. 7A, by a lithography and a dry etching, the first insulating film 522 is formed with a trench formation opening 523 exposing part of the top surface of the ring-shaped third electrode 521 and part of the third interlayer insulating film 516 existing within the ring of the third electrode 521. Then, using the third electrode 521 as a mask, portions of the third interlayer insulating film 516, the second interlayer insulating film 509, and the first interlayer insulating film 503 exposed in the ring of the ring-shaped third electrode 521 are selectively removed by a dry etching, and then a portion of the silicon substrate 500 exposed within the ring of the third electrode 521 is selectively removed by a dry etching using a dry etcher for deeply etching silicon. In this manner, a penetrating electrode formation trench 524 is formed which penetrates the third interlayer insulating film 516, the second interlayer insulating film 509, and the first interlayer insulating film 503 to reach the inside of the silicon substrate 500. In this process, the etching depth of the silicon substrate 500 is, for example, 50 μm or more, and this etching is completed midway through the thickness of the silicon substrate 500. Thereafter, by a CVD method, for example, an insulating film 525 for side-wall insulating film formation made of a TEOS oxide film is deposited on the top surface of the first insulating film 522, the bottom surface and side wall of the trench formation opening 523, and the bottom surface and side wall of the penetrating electrode formation trench 524.

As shown in FIG. 7B, onto the insulating film 525 for side-wall insulating film formation, a photoresist is applied to fill the trench formation opening 523 and the penetrating electrode formation trench 524. After selective light-exposure over the photoresist, only the light-exposed portion of the photoresist is selectively removed to allow a portion 526 of the photoresist unexposed to light to remain in the silicon substrate 500 and the first interlayer insulating film 503 with the insulating film 525 for side-wall insulating film formation interposed therebetween. Then, by a wet etching, a portion of the insulating film 525 for side-wall insulating film formation where the photoresist 526 is absent is selectively removed to expose the top surface of the ring-shaped third electrode 521, the inner surfaces of the ring-shaped third and second electrodes 521 and 515, and the inner surfaces of the ring-shaped second and first vias 519 and 512 for making connection between electrodes and concurrently to form a side-wall insulating film 525a on the side wall of the penetrating electrode formation trench 524 located in the silicon substrate 500 and the first interlayer insulating film 503. Thus, the formation process of the side-wall insulating film should be conducted so that in a later step of forming a penetrating electrode (see FIG. 7D), the side-wall insulating film 525a will be interposed between the penetrating electrode 528 and the silicon substrate 500.

As shown in FIG. 7C, only the photoresist 526 is selectively removed which remains in the silicon substrate 500 and the first interlayer insulating film 503 with the side-wall insulating film 525a interposed therebetween. Next, a seed layer (not shown) is formed in the trench formation opening 523 and the penetrating electrode formation trench 524, and then by an electroless plating technique, a conductive material 527 is grown on the first insulating film 522 to fill the trench formation opening 523 and the penetrating electrode formation trench 524.

Subsequently, as shown in FIG. 7D, by a CMP technique, a portion of the conductive material 527 existing on the top of the first insulating film 522 is selectively removed, and the bottom surface of the silicon substrate 500 is polished to expose the bottom surface of the conductive material 527. In the manner described above, a penetrating electrode 528 penetrating the semiconductor chip is formed.

Thereafter, although not shown, a second insulating film (see 529 in FIG. 5) is deposited on the bottom surface of the silicon substrate 500. Then, by a lithography and a dry etching, a portion of the second insulating film existing on the bottom surface of the penetrating electrode 528 is selectively removed.

In the manner described above, the semiconductor chip as shown in FIG. 5 can be fabricated which has the penetrating electrode 528 and the shielding interconnect 530 arranged to surround the penetrating electrode 528.

In this chip, the penetrating electrode 528 is in contact not only with the inner surfaces of the second electrode 515 and the third electrode 521 but also with the inner surfaces of the first and second vias 512 and 519 for electrode connection and a portion of the top surface of the third electrode 521.

Also in this chip, the shielding interconnect 530 is constructed in the manner in which the contact 505 for the shielding interconnect, the first interconnect 507 for the shielding interconnect, the first via 511 for the shielding interconnect, the second interconnect 514 for the shielding interconnect, the second via 518 for the shielding interconnect, and the third interconnect 520 for the shielding interconnect are electrically connected in the listed order from bottom to top.

The semiconductor chips fabricated in the manner described above are stacked on a semiconductor package, and the penetrating electrodes of the respective semiconductor chips are electrically connected to each other. Thereby, the semiconductor integrated circuit device can be fabricated in which the penetrating electrodes electrically connect the electrodes of the semiconductor chips to the semiconductor package.

With the method for fabricating a semiconductor integrated circuit device according to the fifth embodiment, the penetrating electrode 528 is in contact not only with the inner surfaces of the second electrode 515 and the third electrode 521, but also with the inner surfaces of the first via 512 and the second via 519 for making connection between electrodes and with a portion of the top surface of the third electrode 521.

Thus, the penetrating electrode 528 has, as the points electrically connected to the first, second, and third electrodes 508, 515, and 521, not only the contact points with the inner surfaces of the second electrode 515 and the third electrode 521, but also the contact points with the inner surfaces of the first via 512 and the second via 519 for making connection between electrodes and with the portion of the top surface of the third electrode 521, so that the areas of the portions of the penetrating electrode electrically connected to the first, second, and third electrodes 508, 515, and 521 can be increased. Therefore, degradation in the yield due to the imperfect contact between the penetrating electrode and the electrode can be prevented, and the contact resistance between the penetrating electrode and the electrode can be reduced.

Moreover, with the method for fabricating a semiconductor integrated circuit device according to the fifth embodiment, the shielding interconnect 530 surrounding the penetrating electrode 528 is arranged to be interposed between the penetrating electrode 528 and an internal circuit of the semiconductor chip (for example, the internal circuit such as the transistor 502). Therefore, like the second and third embodiments described above, electromagnetic interference such as crosstalk from the internal circuit into the penetrating electrode 528 can be eliminated.

Sixth Embodiment

A method for fabricating a semiconductor integrated circuit device according to a sixth embodiment of the present invention will be described below with reference to FIGS. 9A to 9D and 10A to 10D. FIGS. 9A to 9D and 10A to 10D are sectional views showing main process steps of the method for fabricating a semiconductor integrated circuit device according to the sixth embodiment of the present invention.

Figure 8:
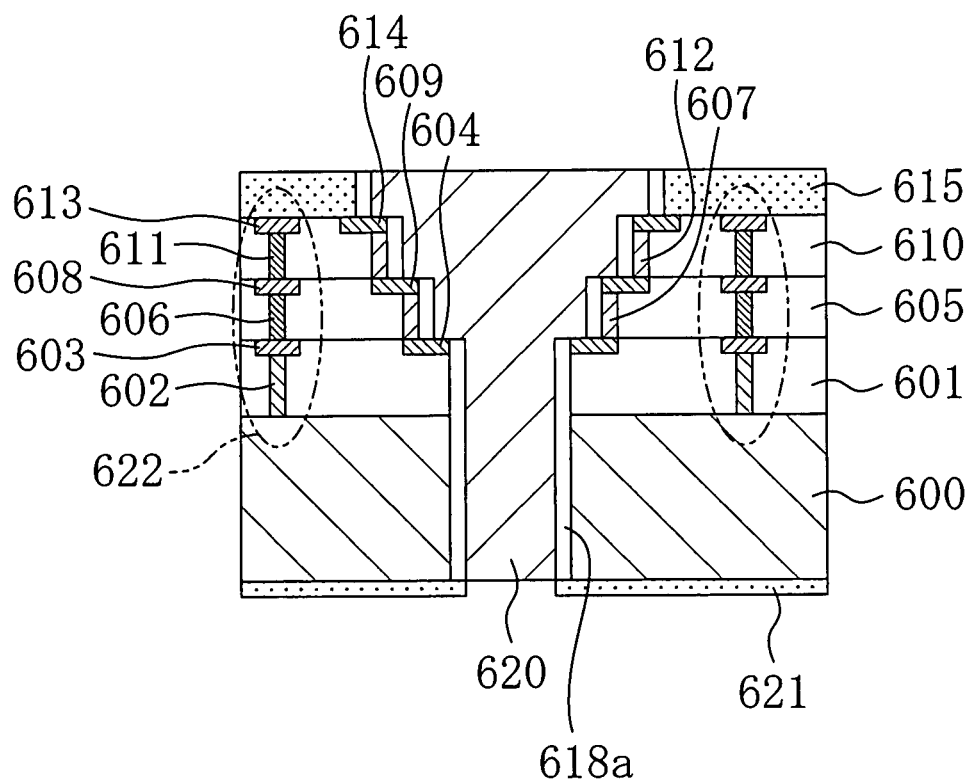
FIG. 8 is a sectional view showing the structure of a semiconductor chip constituting a semiconductor integrated circuit device according to a sixth embodiment of the present invention.

A characteristic point of the sixth embodiment is that in order to accomplish the first object (prevention of degradation in yield) and the second object (reduction in contact resistance), a penetrating electrode is brought into contact with a portion of the top surface of an electrode. Specifically, in the first to fifth embodiments described above, the penetrating electrode is brought into contact with the side face of the interelectrode connection via, while in the sixth embodiment, the penetrating electrode is brought into contact with a portion of the top surface of the electrode. FIG. 8 is a sectional view showing the structure of a semiconductor chip constituting the semiconductor integrated circuit device according to the sixth embodiment of the present invention. As shown in FIG. 8, a penetrating electrode 620 is in contact with portions of the top surfaces of first, second, and third electrodes 604, 609, and 614.

As shown in FIG. 9A, a first interlayer insulating film 601 is deposited on a silicon substrate 600 having an element such as a transistor (not shown) on the surface thereof. By a lithography and a dry etching, the first interlayer insulating film 601 is formed with a ring-shaped contact hole for a shielding interconnect reaching the silicon substrate 600. Subsequently, the inside of the contact hole for a shielding interconnect is filled with a conductive material to form a ring-shaped contact 602 for a shielding interconnect.

Then, by a lithography and a dry etching, the first interlayer insulating film 601 is formed with: a ring-shaped first interconnect recess for a shielding interconnect which reaches the top end of the contact 602 for a shielding interconnect; and a ring-shaped recess for a first electrode which has an opening on the inner side of the opening of the first interconnect recess for a shielding interconnect. The inside of the first interconnect recess for a shielding interconnect and the inside of the recess for a first electrode are filled with a conductive material to form: a ring-shaped first interconnect 603 for a shielding interconnect connected at its bottom surface to the top end of the contact 602 for a shielding interconnect; and a ring-shaped first electrode 604.

Subsequently, as shown in FIG. 9B, a second interlayer insulating film 605 is deposited on the first interlayer insulating film 601. Then, by a lithography and a dry etching, the second interlayer insulating film 605 is formed with: a ring-shaped first via hole for a shielding interconnect, which reaches the top surface of the first interconnect 603 for a shielding interconnect; and a ring-shaped first via hole for making connection between electrodes, which reaches the top surface of the first electrode 604. Subsequently, by a lithography and a dry etching, the second interlayer insulating film 605 is formed with: a ring-shaped second interconnect recess for a shielding interconnect communicated with the first via hole for a shielding interconnect; and a ring-shaped recess for a second electrode communicated with the first via hole for making connection between electrodes. Subsequently, the inside of the first via hole and the second interconnect recess for a shielding interconnect and the inside of the first via hole for making connection between electrodes and the recess for a second electrode are filled with a conductive material to form: a ring-shaped second interconnect 608 for a shielding interconnect connected at its bottom surface to the ring-shaped first via 606 for a shielding interconnect; and a ring-shaped second electrode 609 connected at its bottom surface to the ring-shaped first via 607 for making connection between electrodes. In this step, as shown in FIG. 9B, the second electrode 609 is formed so that the inside diameter of the ring-shaped second electrode 609 is greater than that of the ring-shaped first electrode 604.

As shown in FIG. 9C, a third interlayer insulating film 610 is deposited on the second interlayer insulating film 605. Then, by a lithography and a dry etching, the third interlayer insulating film 610 is formed with: a ring-shaped second via hole for a shielding interconnect, which reaches the top surface of the second interconnect 608 for a shielding interconnect; and a ring-shaped second via hole for making connection between electrodes, which reaches the top surface of the second electrode 609. Subsequently, by a lithography and a dry etching, the third interlayer insulating film 610 is formed with: a ring-shaped third interconnect recess for a shielding interconnect communicated with the second via hole for a shielding interconnect; and a ring-shaped recess for a third electrode communicated with the second via hole for making connection between electrodes. The inside of the second via hole and the third interconnect recess for a shielding interconnect and the inside of the second via hole for making connection between electrodes and the recess for a third electrode are filled with a conductive material to form: a ring-shaped third interconnect 613 for a shielding interconnect connected at its bottom surface to the top end of the ring-shaped second via 611 for a shielding interconnect; and a ring-shaped third electrode 614 connected at its bottom surface to the top end of the ring-shaped second via 612 for making connection between electrodes. In this step, as shown in FIG. 9C, the third electrode 614 is formed so that the inside diameter of the ring-shaped third electrode 614 is greater than that of the ring-shaped second electrode 609.

In order to expose portions of the top surfaces of the electrodes in a later process of forming a penetrating electrode formation trench (see FIG. 9D), the electrode formation process (see FIGS. 9A to 9C) is carried out so that the ring-shaped electrode located in the upper layer is formed to have a greater inside diameter than the ring-shaped electrode located in the lower layer, thereby arranging the electrodes to shift stepwise.

For brevity of description, in the fabrication method according to the sixth embodiment, a formation step of an interconnect layer serving as the topmost layer is carried out in the step shown in FIG. 9C. However, in the actual fabrication method, the previous step shown in FIG. 9B may be repeatedly conducted to form a multilayer interconnection substrate in which a greater number of interconnect layers are multilayered.

Also, for brevity of description, in the sixth embodiment, description is omitted of an element connection contact (see 504 in FIG. 5 shown above) electrically connected to an element such as a transistor (see 502 in FIG. 5), first and second element interconnects (see 506 and 513 in FIG. 5), and first and second vias for making connection between element interconnects (see 510 and 517 in FIG. 5). However, in the sixth embodiment, like the fifth embodiment described above, the semiconductor chip is constructed so that it has the element connection contacts, the element interconnects, and the vias for making connection between element interconnects, and that at least one of the electrodes 604, 609, and 614 formed in the interlayer insulating films 601, 605, and 610, respectively, is electrically connected to the element. In this construction, like the fifth embodiment, the shapes of the via and the interconnect for a shielding interconnect in the interlayer insulating film formed with the electrode electrically connected to the element are controlled in order not to bring the electrode electrically connected to the element into contact with the via and the interconnect for a shielding interconnect.

As shown in FIG. 9C, for example, a first insulating film 615 made of a nitride film is deposited on the third interlayer insulating film 610, and then the first insulating film 615 is formed with a trench formation opening 616 exposing a portion of the top surface of the ring-shaped third electrode 614 and a portion of the third interlayer insulating film 610 existing within the ring of the third electrode 614.

Next, as shown FIG. 9D, using the third, second, and first electrodes 614, 609, and 604 as a mask, a portion of the third interlayer insulating film 610 exposed within the ring of the ring-shaped third electrode 614, a portion of the second interlayer insulating film 605 exposed within the ring of the ring-shaped second electrode 609, and a portion of the first interlayer insulating film 601 exposed within the ring of the ring-shaped first electrode 604 are selectively removed by a dry etching. Then, a portion of the silicon substrate 600 exposed within the ring of the ring-shaped first electrode 604 is selectively removed by a dry etching using a dry etcher for deeply etching silicon. In this manner, a penetrating electrode formation trench 617 is formed which penetrates the interlayer insulating films 610, 605, and 601 to reach the inside of the silicon substrate 600. In this process, the etching depth of the silicon substrate 600 is, for example, 50 μm or more, and this etching is completed midway through the thickness of the silicon substrate 600.

As described above, in the previous process of forming the electrode (see FIGS. 9A to 9C), the ring-shaped electrode located in the upper layer is formed to have a greater inside diameter than the ring-shaped electrode located in the lower layer, thereby arranging the electrodes to shift stepwise. Thereby, as shown in FIG. 9D, portions of the top surfaces of the electrodes can be exposed in the process of forming a penetrating electrode formation trench.

Figure 10A:
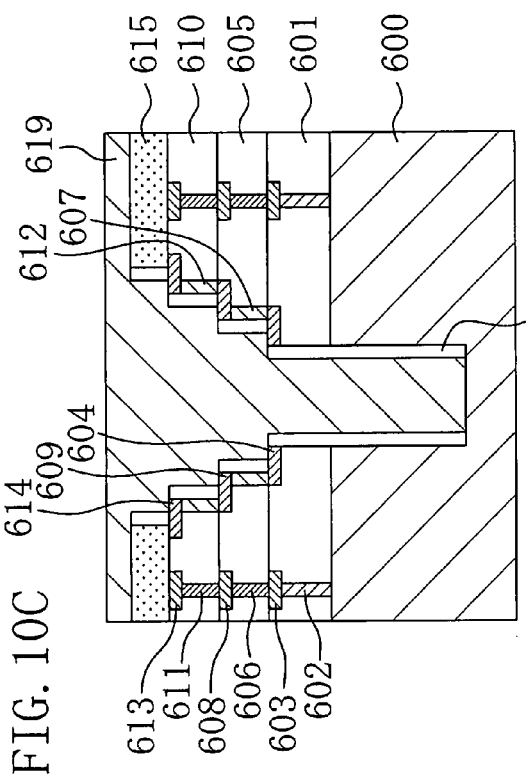
FIGS. 10A to 10D are sectional views showing main process steps of the method for fabricating a semiconductor integrated circuit device according to the sixth embodiment of the present invention.

Next, as shown in FIG. 10A, by a CVD method, for example, an insulating film 618 for side-wall insulating film formation made of a TEOS oxide film is deposited on the top surface of the first insulating film 615, the bottom surface and side wall of the trench formation opening 616, and the bottom surface and side wall of the penetrating electrode formation trench 617.

Figure 10C:
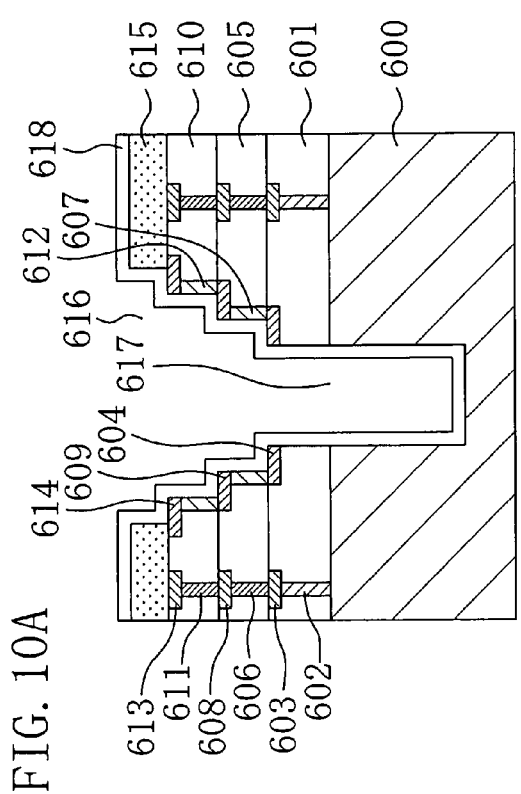
Figure 10B:
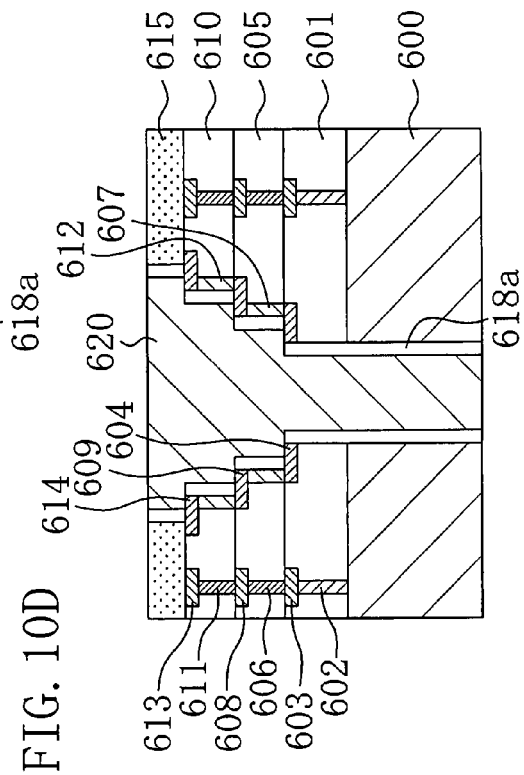

As shown in FIG. 10B, by an anisotropic dry etching, portions of the insulating film 618 for side-wall insulating film formation existing the top surface of the first insulating film 615, the bottom of the trench formation opening 616, and the bottom of the penetrating electrode formation trench 617 are selectively removed to expose portions of the top surfaces of the ring-shaped third electrode 614, the second electrode 609, and the first electrode 604 and to form a side-wall insulating film 618a on the side walls of the trench formation opening 616 and the penetrating electrode formation trench 617. Thus, the formation process of the side-wall insulating film should be conducted so that in a later step of forming a penetrating electrode (see FIG. 10D), the side-wall insulating film 618a will be interposed between the penetrating electrode 620 and the silicon substrate 600.

As shown in FIG. 10C, a seed layer (not shown) is formed in the trench formation opening 616 and the penetrating electrode formation trench 617, and then by a electroless plating technique, a conductive material 619 is grown on the first insulating film 615 to fill the trench formation opening 616 and the penetrating electrode formation trench 617.

Figure 10D:
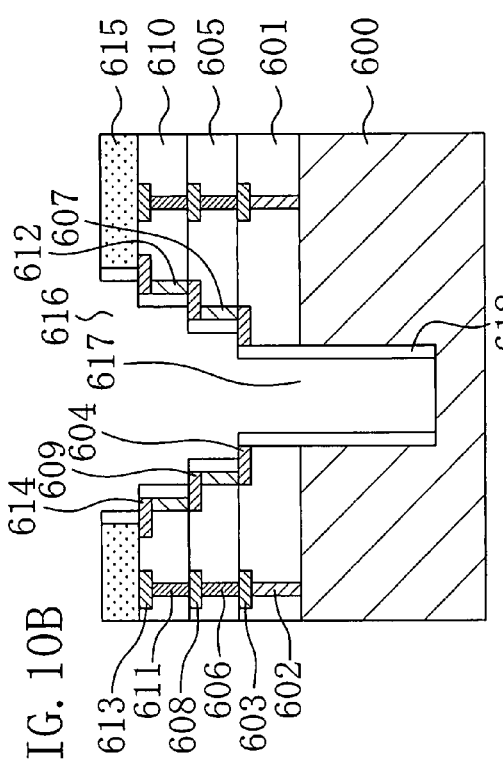

Subsequently, as shown in FIG. 10D, by a CMP technique, a portion of the conductive material 619 existing on the top of the first insulating film 615 is selectively removed, and the bottom surface of the semiconductor substrate 600 is polished to expose the bottom surface of the conductive material 619. In the manner described above, a penetrating electrode 620 penetrating the semiconductor chip is formed.

Thereafter, although not shown, a second insulating film (see 621 in FIG. 8) is deposited on the bottom surface of the silicon substrate 600. Then, by a lithography and a dry etching, a portion of the second insulating film existing on the bottom surface of the penetrating electrode 620 is selectively removed.

In the manner described above, the semiconductor chip as shown in FIG. 8 is fabricated which has the penetrating electrode 620 penetrating the semiconductor chip and the shielding interconnect 622 arranged to surround the penetrating electrode 620.

In this chip, the penetrating electrode 620 is in contact with the portions of the top surfaces of the ring-shaped first, second, and third electrodes 604, 609, and 614.

Also in this chip, the shielding interconnect 622 is constructed in the manner in which the contact 602 for the shielding interconnect, the first interconnect 603 for the shielding interconnect, the first via 606 for the shielding interconnect, the second interconnect 608 for the shielding interconnect, the second via 611 for the shielding interconnect, and the third interconnect 613 for the shielding interconnect are electrically connected in the listed order from bottom to top.

The semiconductor chips fabricated in the manner described above are stacked on a semiconductor package, and the penetrating electrodes of the respective semiconductor chips are electrically connected to each other. Thereby, the semiconductor integrated circuit device can be fabricated in which the penetrating electrodes electrically connect the electrodes of the semiconductor chips to the semiconductor package.

Hereinafter, the sixth embodiment will be described in detail in comparison with the fifth embodiment mentioned above.

First, in the sixth embodiment, as shown in FIG. 8, the penetrating electrode 620 is brought into contact with the portions of the top surfaces of all of the first, second, and third electrodes 604, 609, and 614. In contrast to this, in the fifth embodiment, as shown in FIG. 5, the penetrating electrode 528 is brought into contact not only with the inner surfaces of the second and third electrodes 515 and 521 but also the inner surfaces of the first and second vias 512 and 519 for making connection between electrodes (and with a portion of the top surface of the third electrode 521).

For brevity of illustration, the figures employed show the components so that the vertical reduction ratio is smaller than the horizontal reduction ratio. Therefore, in practice, the areas of the portions of the penetrating electrode in contact with the portions of the top surfaces of the electrodes are far greater than the areas of the portions of the penetrating electrode in contact with the inner surfaces of the interelectrode connection vias and the areas of the portions of the penetrating electrode in contact with the inner surfaces of the electrodes.

From this, in the sixth embodiment, by bring the penetrating electrode 620 into contact with the portions of the top surfaces of all of the first, second, and third electrodes 604, 609, and 614, the areas of the portions of the penetrating electrode electrically connected to the electrodes can be further increased as compared with the case like the fifth embodiment where the penetrating electrode 528 is brought into contact not only with the inner surfaces of the second and third electrodes 515 and 521 but also the inner surfaces of the first and second vias 512 and 519 for making connection between electrodes (and with a portion of the top surface of the third electrode 521).

With this structure, in the sixth embodiment, even though the side-wall insulating film 618a is interposed between the penetrating electrode 620 and the first, second, and third electrodes 604, 609, and 614 and between the penetrating electrode 620 and the first and second vias 606 and 611, degradation in the yield due to the imperfect contact between the penetrating electrode and the electrode can be further prevented and the contact resistance between the penetrating electrode and the electrode can be further reduced as compared with the fifth embodiment described above.

Second, in the sixth embodiment, the formation process of the side-wall insulating film is conducted in the following manner. The insulating film 618 for side-wall insulating film formation is deposited as shown in FIG. 10A, and then by an anisotropic anisotropic dry etching, the side-wall insulating film 618a (see FIG. 10B) is formed in the state in which the portions of the top surfaces of the first, second, and third electrodes 604, 609, and 614 are exposed as shown in FIG. 10B.

In contrast to this, in the fifth embodiment described above, the formation process of the side-wall insulating film is conducted in the following manner. The insulating film 525 for side-wall insulating film formation is deposited as shown in FIG. 7A. Then, as shown in FIG. 7B, the step of applying a photoresist, the step of selectively light-exposing the photoresist, and the step of selectively removing the photoresist are sequentially conducted, and then by a wet etching, the side-wall insulating film 525a is formed in the state in which the inner surfaces of the second and third electrodes 515 and 521 and the first and second vias 512 and 519 for making connection between electrodes are exposed. Furthermore, as shown in FIG. 7C, the step of removing the photoresist 526 is conducted.

Thus, in the sixth embodiment, by bringing the penetrating electrode into contact with a portion of the top surface of the electrode, the number of steps conducted in the formation process of the side-wall insulating film can be reduced as compared with the case like the fifth embodiment where the penetrating electrode is brought into contact not only with the inner surfaces of the electrodes but also the inner surfaces of the interelectrode connection vias. Therefore, the fabrication cost of the semiconductor integrated circuit device can be reduced.

As described above, with the method for fabricating a semiconductor integrated circuit device according to the sixth embodiment, the penetrating electrode 620 is brought into contact into the portions of the top surfaces of the first, second, and third electrodes 604, 609, and 614. In this structure of the device, as shown above, the areas of the portions of the penetrating electrode in contact with the portions of the top surfaces of the electrodes are far greater than the areas of the portions of the penetrating electrode in contact with the inner surfaces of the electrodes and the areas of the portions of the penetrating electrode in contact with the inner surfaces of the interelectrode connection vias.

From this, the areas of the portions of the penetrating electrode in contact with the electrodes can be increased as compared with the case like the conventional technique where the penetrating electrode is brought into contact with the inner surface of the electrode. Therefore, degradation in the yield due to the imperfect contact between the penetrating electrode and the electrode can be prevented and the contact resistance between the penetrating electrode and the electrode can be reduced.

Moreover, with the method for fabricating a semiconductor integrated circuit device according to the sixth embodiment, as described above, the areas of the portions of the penetrating electrode electrically connected to the electrodes can be further increased as compared with the fifth embodiment. Therefore, degradation in the yield due to the imperfect contact between the penetrating electrode and the electrode can be further prevented and the contact resistance between the penetrating electrode and the electrode can be further reduced.

In addition to this, with the method for fabricating a semiconductor integrated circuit device according to the sixth embodiment, as described above, the number of steps conducted in the formation process of the side-wall insulating film can be reduced as compared with the fifth embodiment. Therefore, the fabrication cost of the semiconductor integrated circuit device can be reduced.

Furthermore, with the method for fabricating a semiconductor integrated circuit device according to the sixth embodiment, the shielding interconnect 622 surrounding the penetrating electrode 620 is arranged to be interposed between the penetrating electrode 620 and the internal circuit of the semiconductor chip. Therefore, like the second and third embodiments described above, electromagnetic interference such as crosstalk from the internal circuit (for example, an internal circuit such as interconnects or elements located in a region formed with the interconnects and elements) into the penetrating electrode 620 can be eliminated.

Seventh Embodiment

A method for fabricating a semiconductor integrated circuit device according to a seventh embodiment of the present invention will be described below with reference to FIGS. 12A to 12D and 13A to 13D. FIGS. 12A to 12D and 13A to 13D are sectional views showing main process steps of the method for fabricating a semiconductor integrated circuit device according to the seventh embodiment of the present invention.

Figure 11:
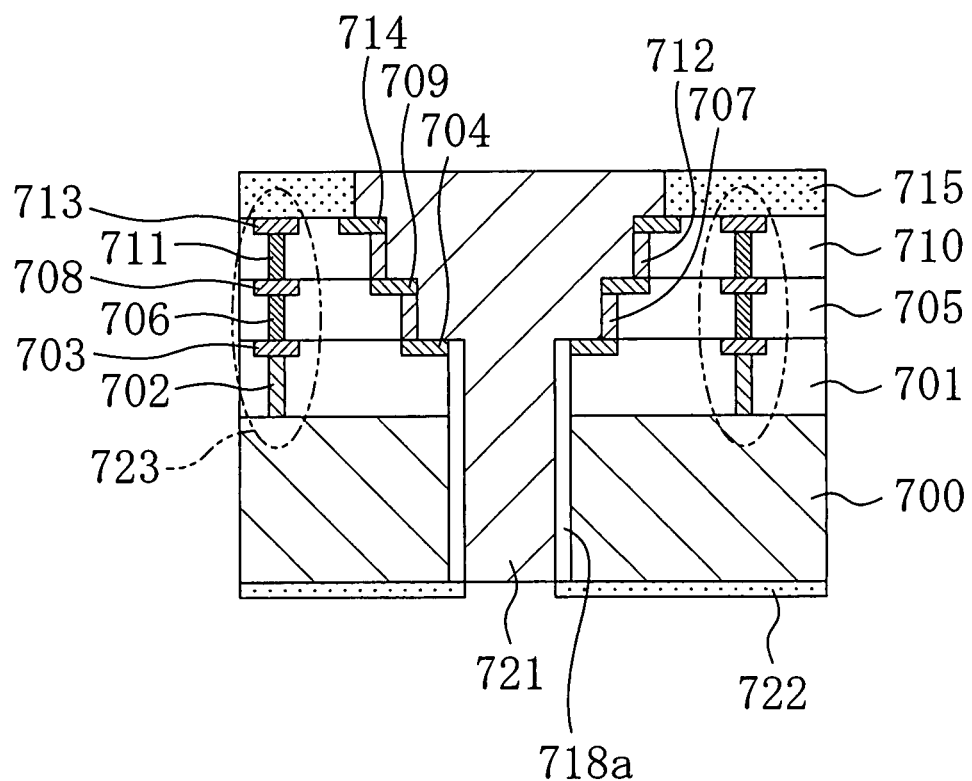
FIG. 11 is a sectional view showing the structure of a semiconductor chip constituting a semiconductor integrated circuit device according to a seventh embodiment of the present invention.

A characteristic point of the seventh embodiment is that in order to accomplish the first object (prevention of degradation in yield) and the second object (reduction in contact resistance), not only a penetrating electrode is brought into contact with a portion of the top surface of an electrode like the sixth embodiment described above, but also the penetrating electrode is brought into contact with the side face of an interelectrode connection via like the first to fifth embodiments described above. The seventh embodiment aims, with this characteristic point, at further prevention of degradation in yield and further reduction of the contact resistance. FIG. 11 is a sectional view showing the structure of a semiconductor chip constituting the semiconductor integrated circuit device according to the seventh embodiment of the present invention. As shown in FIG. 11, a penetrating electrode 721 is in contact not only with portions of the top surfaces of first, second, and third electrodes 704, 709, and 714 but also with, in addition to the inner surfaces of the second and third electrodes 709 and 714, the inner surfaces of first and second vias 707 and 712 for making connection between electrodes.

Figure 12A:
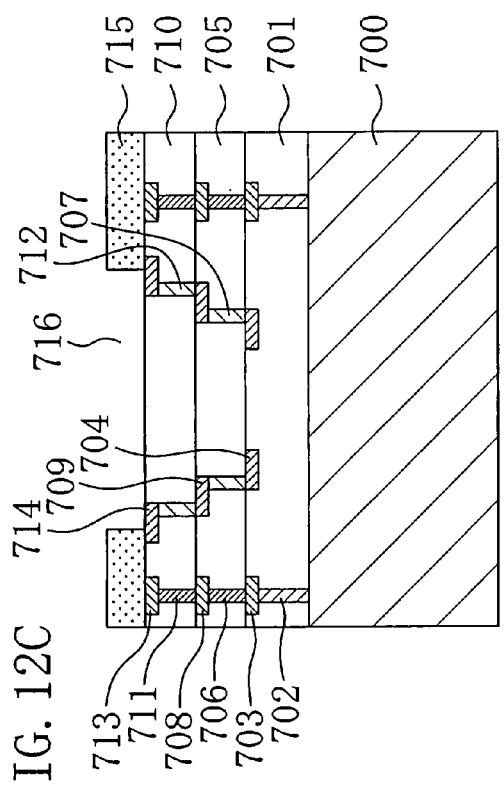
FIGS. 12A to 12D are sectional views showing main process steps of a method for fabricating a semiconductor integrated circuit device according to the seventh embodiment of the present invention.

As shown in FIG. 12A, a first interlayer insulating film 701 is deposited on a silicon substrate 700 having an element such as a transistor (not shown) on the surface thereof. By a lithography and a dry etching, the first interlayer insulating film 701 is formed with a ring-shaped contact hole for a shielding interconnect reaching the silicon substrate 700, and then the inside of the contact hole for a shielding interconnect is filled with a conductive material to form a ring-shaped contact 702 for a shielding interconnect.

By a lithography and a dry etching, the first interlayer insulating film 701 is formed with: a ring-shaped first interconnect recess for a shielding interconnect which reaches the top end of the contact 702 for a shielding interconnect; and a ring-shaped recess for a first electrode which has an opening on the inner side of the opening of the first interconnect recess for a shielding interconnect, and then the inside of the first interconnect recess for a shielding interconnect and the inside of the recess for a first electrode are filled with a conductive material to form: a ring-shaped first interconnect 703 for a shielding interconnect connected at its bottom surface to the top end of the contact 702 for a shielding interconnect; and a ring-shaped first electrode 704.

Figure 12C:
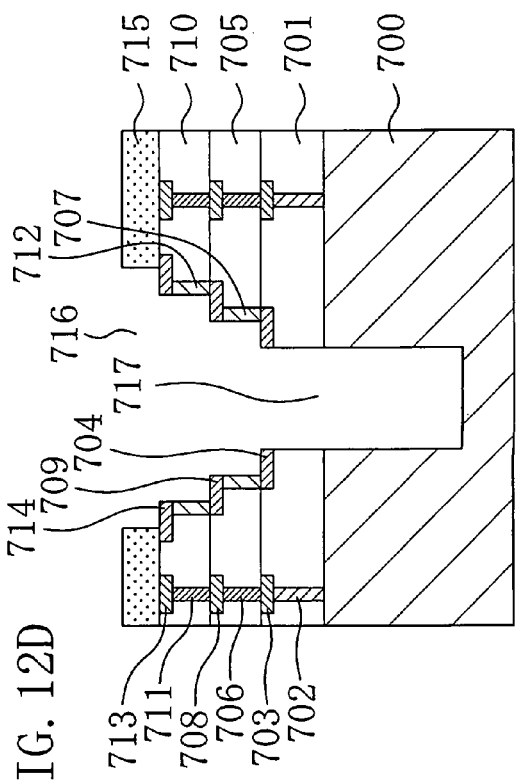
Figure 12B:
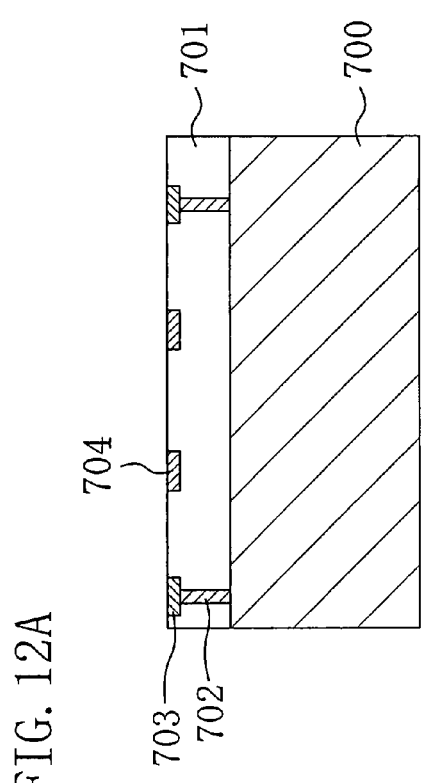

Subsequently, as shown in FIG. 12B, a second interlayer insulating film 705 is deposited on the first interlayer insulating film 701. Then, by a lithography and a dry etching, the second interlayer insulating film 705 is formed with: a ring-shaped first via hole for a shielding interconnect, which reaches the top surface of the first interconnect 703 for a shielding interconnect; and a ring-shaped first via hole for making connection between electrodes, which reaches the top surface of the first electrode 704. Subsequently, by a lithography and a dry etching, the second interlayer insulating film 705 is formed with: a ring-shaped second interconnect recess for a shielding interconnect communicated with the first via hole for a shielding interconnect; and a ring-shaped recess for a second electrode communicated with the first via hole for making connection between electrodes. Subsequently, the inside of the first via hole and the second interconnect recess for a shielding interconnect and the inside of the first via hole for making connection between electrodes and the recess for a second electrode are filled with a conductive material to form: a ring-shaped second interconnect 708 for a shielding interconnect connected at its bottom surface to the ring-shaped first via 706 for a shielding interconnect; and a ring-shaped second electrode 709 connected at its bottom surface to the ring-shaped first via 707 for making connection between electrodes. In this step, as shown in FIG. 12B, the second electrode 709 is formed so that the inside diameter of the ring-shaped second electrode 709 is greater than that of the ring-shaped first electrode 704.

As shown in FIG. 12C, a third interlayer insulating film 710 is deposited on the second interlayer insulating film 705. Then, by a lithography and a dry etching, the third interlayer insulating film 710 is formed with: a ring-shaped second via hole for a shielding interconnect, which reaches the top surface of the second interconnect 708 for a shielding interconnect; and a ring-shaped second via hole for making connection between electrodes, which reaches the top surface of the second electrode 709. Subsequently, by a lithography and a dry etching, the third interlayer insulating film 710 is formed with: a ring-shaped third interconnect recess for a shielding interconnect communicated with the second via hole for a shielding interconnect; and a ring-shaped recess for a third electrode communicated with the second via hole for making connection between electrodes. The inside of the second via hole and the third interconnect recess for a shielding interconnect and the inside of the second via hole for making connection between electrodes and the recess for a third electrode are filled with a conductive material to form: a ring-shaped third interconnect 713 for a shielding interconnect connected at its bottom surface to the top end of the ring-shaped second via 711 for a shielding interconnect; and a ring-shaped third electrode 714 connected at its bottom surface to the top end of the ring-shaped second via 712 for making connection between electrodes. In this step, as shown in FIG. 12C, the third electrode 714 is formed so that the inside diameter of the ring-shaped third electrode 714 is greater than that of the ring-shaped second electrode 709.

In order to expose portions of the top surfaces of the electrodes in a later process of forming a penetrating electrode formation trench (see FIG. 12D), the electrode formation process (see FIGS. 12A to 12C) is carried out so that the ring-shaped electrode located in the upper layer is formed to have a greater inside diameter than the ring-shaped electrode located in the lower layer, thereby arranging the electrodes to shift stepwise.

For brevity of description, in the fabrication method according to the seventh embodiment, a formation step of an interconnect layer serving as the topmost layer is carried out in the step shown in FIG. 12C. However, in the actual fabrication method, the previous step shown in FIG. 12C may be repeatedly conducted to form a multilayer interconnection substrate in which a greater number of interconnect layers are multilayered.

Also, for brevity of description, in the seventh embodiment, description is omitted of an element connection contact (see 504 in FIG. 5 shown above) electrically connected to an element such as a transistor (see 502 in FIG. 5), first and second element interconnects (see 506 and 513 in FIG. 5), and first and second vias for making connection between element interconnects (see 510 and 517 in FIG. 5). However, in the seventh embodiment, like the fifth embodiment described above, the semiconductor chip is constructed so that it has the element connection contacts, the element interconnects, and the vias for making connection between element interconnects, and that at least one of the electrodes 704, 709, and 714 formed in the interlayer insulating films 701, 705, and 710, respectively, is electrically connected to the element. In this construction, like the fifth embodiment, the shapes of the via and the interconnect for a shielding interconnect in the interlayer insulating film formed with the electrode electrically connected to the element are controlled in order not to bring the electrode electrically connected to the element into contact with the via and the interconnect for a shielding interconnect.

As shown in FIG. 12C, for example, a first insulating film 715 made of a nitride film is deposited on the third interlayer insulating film 710, and then the first insulating film 715 is formed with a trench formation opening 716 exposing a portion of the top surface of the ring-shaped third electrode 714 and a portion of the third interlayer insulating film 710 existing within the ring of the third electrode 714.

Figure 12D:
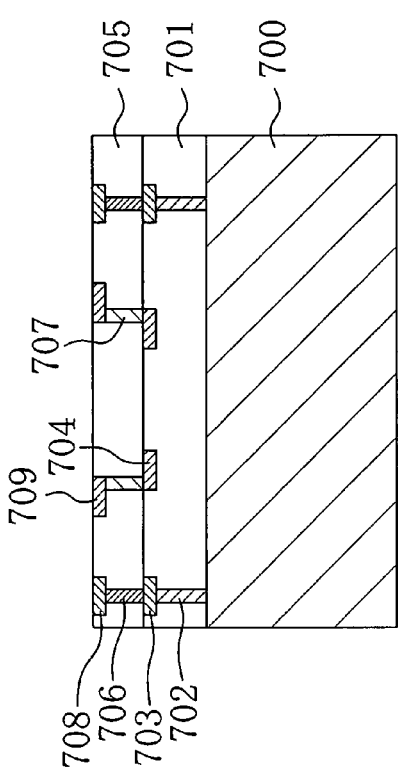

Next, as shown in FIG. 12D, using the third, second, and first electrodes 714, 709, and 704 as a mask, a portion of the third interlayer insulating film 710 existing within the ring of the ring-shaped third electrode 714, a portion of the second interlayer insulating film 705 existing within the ring of the ring-shaped second electrode 709, and a portion of the first interlayer insulating film 701 existing within the ring of the ring-shaped first electrode 704 are selectively removed by a dry etching. Then, a portion of the silicon substrate 700 existing within the ring of the ring-shaped first electrode 704 is selectively removed by a dry etching using a dry etcher for deeply etching silicon. In this manner, a penetrating electrode formation trench 717 is formed which penetrates the third, second, and first interlayer insulating films 710, 705, and 701 to reach the inside of the silicon substrate 700. In this process, the etching depth of the silicon substrate 700 is, for example, 50 μm or more, and this etching is completed midway through the thickness of the silicon substrate 700.

Figure 13A:
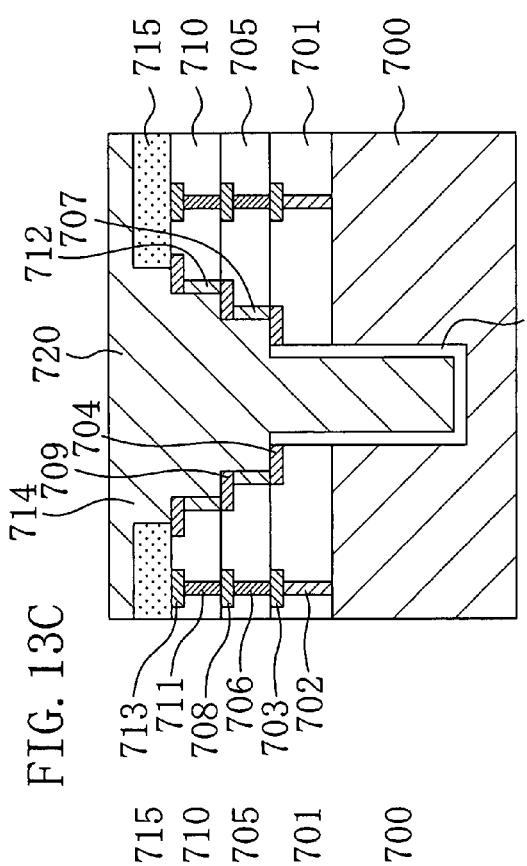
FIGS. 13A to 13D are sectional views showing main process steps of the method for fabricating a semiconductor integrated circuit device according to the seventh embodiment of the present invention.

Next, as shown in FIG. 13A, by a CVD method, for example, an insulating film 718 for side-wall insulating film formation made of a TEOS oxide film is deposited on the top surface of the first insulating film 715, the bottom surface and side wall of the trench formation opening 716, and the bottom surface and side wall of the penetrating electrode formation trench 717.

Figure 13B:
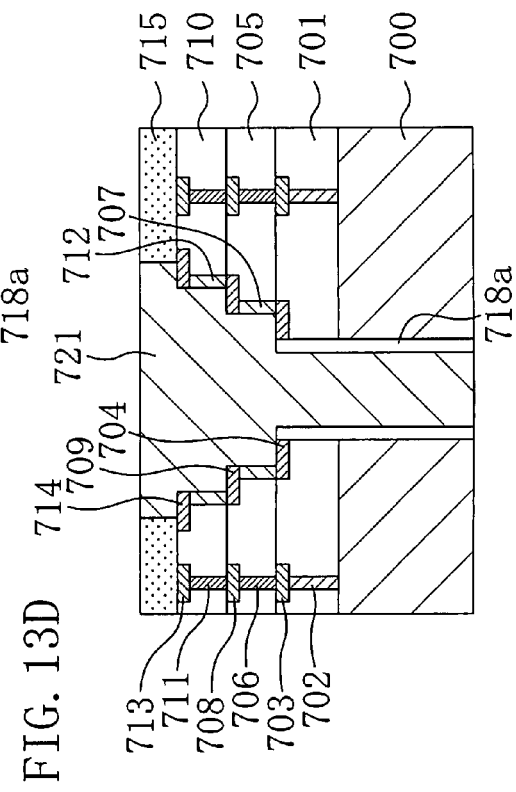

As shown in FIG. 13B, a photoresist is applied onto the insulating film 718 for side-wall insulating film formation to fill the trench formation opening 716 and the penetrating electrode formation trench 717. After selective light-exposure over the photoresist, only the light-exposed portion of the photoresist is selectively removed to allow a portion 719 of the photoresist unexposed to light to remain in the silicon substrate 700 and the first interlayer insulating film 701 with the insulating film 718 for side-wall insulating film formation interposed therebetween. Then, by a wet etching, a portion of the insulating film 718 for side-wall insulating film formation where the photoresist 719 is absent is selectively removed to expose portions of the top surfaces of the third, second, and first electrodes 714, 709, and 704, the inner surfaces of the third and second electrodes 714 and 709, and the inner surfaces of the second and first vias 712 and 707 for making connection between electrodes and concurrently to form a side-wall insulating film 718a on the side wall of the penetrating electrode formation trench 717 located in the silicon substrate 700 and the first interlayer insulating film 701. Thus, the formation process of the side-wall insulating film should be conducted so that in a later step of forming a penetrating electrode (see FIG. 13D), the side-wall insulating film 718a will be interposed between the penetrating electrode 721 and the silicon substrate 700.

Figure 13C:
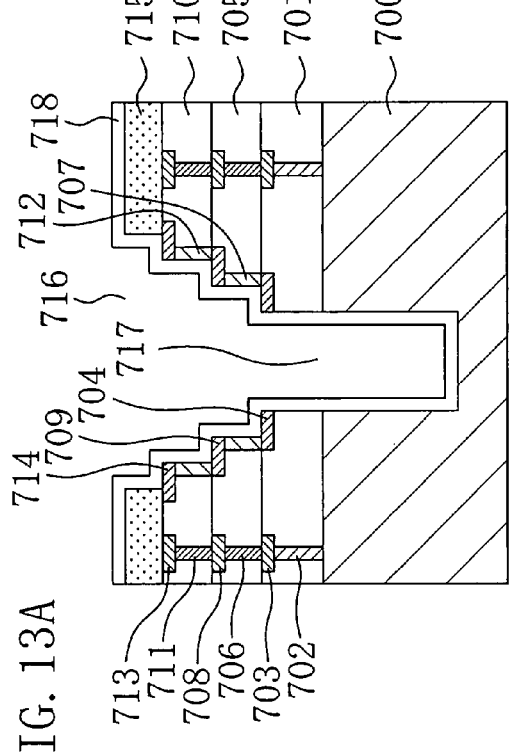

As shown in FIG. 13C, only the photoresist 719 is selectively removed which remains in the silicon substrate 700 and the first interlayer insulating film 701 with the side-wall insulating film 718a interposed therebetween. Next, a seed layer (not shown) is formed in the trench formation opening 716 and the penetrating electrode formation trench 717, and then by an electroless plating technique, a conductive material 720 is grown on the first insulating film 715 to fill the trench formation opening 716 and the penetrating electrode formation trench 717.

Figure 13D:
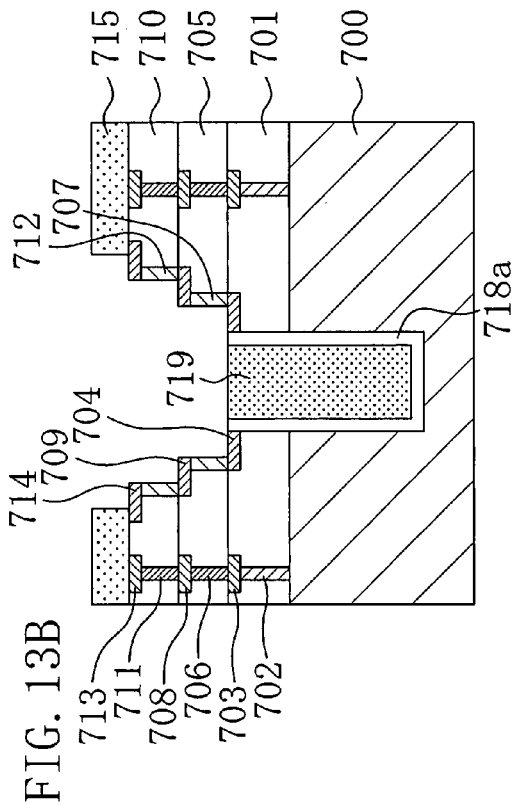

Subsequently, as shown in FIG. 13D, by a CMP technique, a portion of the conductive material 720 existing on the top of the first insulating film 715 is selectively removed, and the bottom surface of the silicon substrate 700 is polished to expose the bottom surface of the conductive material 720. In the manner described above, a penetrating electrode 721 penetrating the semiconductor chip is formed.

Thereafter, although not shown, a second insulating film (see 722 in FIG. 11) is deposited on the bottom surface of the silicon substrate 700. Then, by a lithography and a dry etching, a portion of the second insulating film existing on the bottom surface of the penetrating electrode 721 is selectively removed.

In the manner described above, the semiconductor chip as shown in FIG. 11 is fabricated which has the penetrating electrode 721 and the shielding interconnect 723 arranged to surround the penetrating electrode 721.

In this chip, the penetrating electrode 721 is in contact with the portions of the top surfaces of the first, second, and third electrodes 704, 709, and 714, the inner surfaces of the second and third electrodes 709 and 714, and the inner surfaces of the first and second vias 707 and 712 for making connection between electrodes.

Also in this chip, the shielding interconnect 723 is constructed in the manner in which the contact 702 for the shielding interconnect, the first interconnect 703 for the shielding interconnect, the first via 706 for the shielding interconnect, the second interconnect 708 for the shielding interconnect, the second via 711 for the shielding interconnect, and the third interconnect 713 for the shielding interconnect are electrically connected in the listed order from bottom to top.

The semiconductor chips fabricated in the manner described above are stacked on a semiconductor package, and the penetrating electrodes of the respective semiconductor chips are electrically connected to each other. Thereby, the semiconductor integrated circuit device can be fabricated in which the penetrating electrodes electrically connect the electrodes of the semiconductor chips to the semiconductor package.

With the method for fabricating a semiconductor integrated circuit device according to the seventh embodiment, the penetrating electrode 721 is in contact not only with the portions of the top surfaces of the first, second, and third electrodes 704, 709, and 714 like the sixth embodiment described above, but also with the inner surfaces of the first and second vias 707 and 712 for making connection between electrodes in addition to the inner surfaces of the second and third electrodes 709 and 714 like the fifth embodiment described above.

Thus, the areas of the portions of the penetrating electrode 721 electrically connected to the first, second, and third electrodes 704, 709, and 714 can be further increased as compared with the sixth embodiment. Therefore, degradation in the yield due to the imperfect contact between the penetrating electrode and the electrode can be further prevented, and the contact resistance between the penetrating electrode and the electrode can be further reduced.

Moreover, with the method for fabricating a semiconductor integrated circuit device according to the seventh embodiment, the shielding interconnect 723 surrounding the penetrating electrode 721 is arranged to be interposed between the penetrating electrode 721 and an internal circuit of the semiconductor chip. Therefore, like the second and third embodiments described above, electromagnetic interference such as crosstalk from the internal circuit (for example, an internal circuit such as interconnects or elements located in a region formed with the interconnects and elements) into the penetrating electrode 721 can be eliminated.

In the sixth and seventh embodiments of the present invention, description has been made of the case as a concrete example where by forming the electrodes so that the inside diameter of the second electrode is greater than that of the first electrode and the inside diameter of the third electrode is greater than that of the second electrode, the penetrating electrode is brought into contact with the portions of the top surfaces of the first, second, and third electrodes. However, the present invention is not limited to this case. For example, even in the case where by forming the electrodes so that the inside diameter of the third electrode is greater than that of the second electrode or so that the inside diameter of the second electrode is greater than that of the first electrode, the penetrating electrode is brought into contact with at least one of the portions of the top surfaces of the first, second, and third electrodes, the same effects as the present invention can be offered.

Eighth Embodiment

A method for fabricating a semiconductor integrated circuit device according to an eighth embodiment of the present invention will be described below with reference to FIGS. 15A to 15D and 16A to 16D. FIGS. 15A to 15D and 16A to 16D are sectional views showing main process steps of the method for fabricating a semiconductor integrated circuit device according to the eighth embodiment of the present invention.

Figure 14:
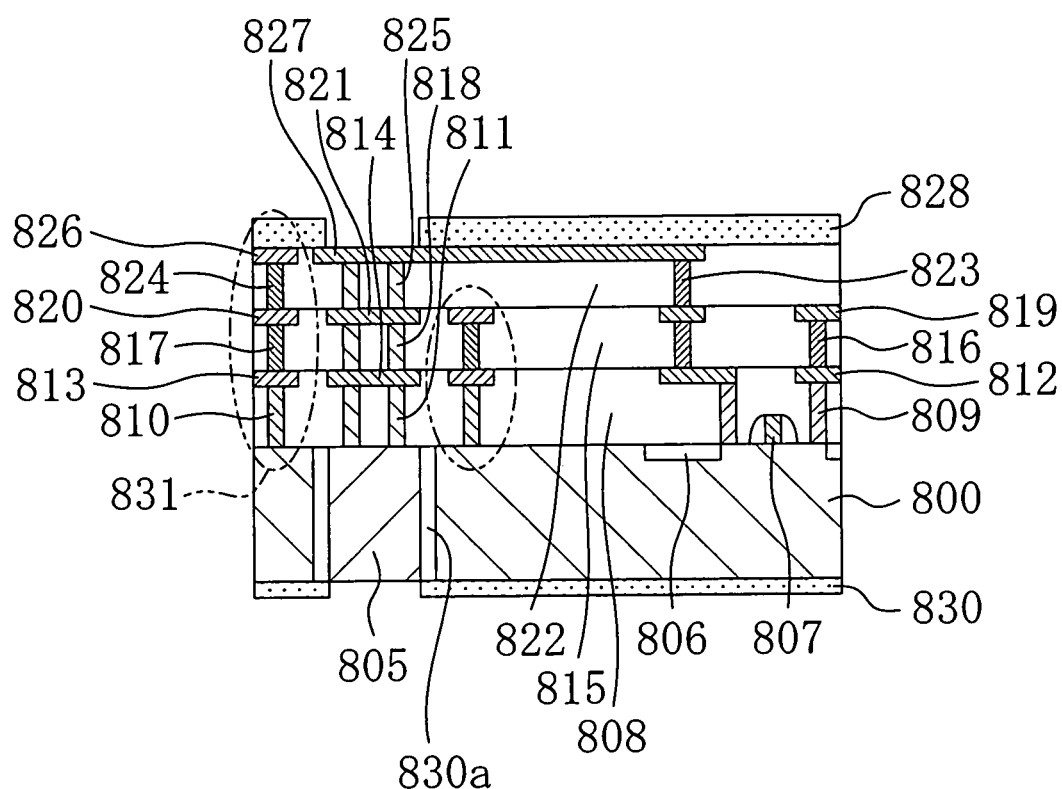
FIG. 14 is a sectional view showing the structure of a semiconductor chip constituting a semiconductor integrated circuit device according to an eighth embodiment of the present invention.

A characteristic point of the eighth embodiment is that in order to accomplish the first object (prevention of degradation in yield), not a penetrating electrode penetrating a semiconductor chip but a penetrating electrode penetrating only a semiconductor substrate included in the semiconductor chip is employed. The first to seventh embodiments described above accomplish the first object and the second object (reduction in contact resistance), while the eighth embodiment accomplishes only the first object. FIG. 14 is a sectional view showing the structure of a semiconductor chip constituting the semiconductor integrated circuit device according to the eighth embodiment of the present invention. As shown in FIG. 14, a penetrating electrode 805 penetrating only a semiconductor substrate 800 is electrically connected to a penetrating-electrode connection via 811 formed in a first interlayer insulating film 808 as the bottommost layer.

Figure 15A:
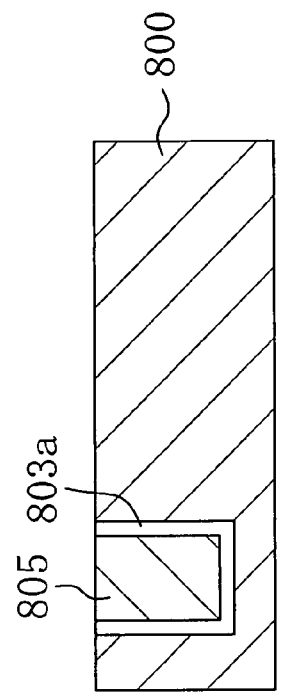
FIGS. 15A to 15D are sectional views showing main process steps of a method for fabricating a semiconductor integrated circuit device according to the eighth embodiment of the present invention.

As shown in FIG. 15A, first, an insulating film 801 is deposited on a semiconductor substrate 800, and by a lithography and a dry etching, an opening exposing the semiconductor substrate 800 is formed. Subsequently, using the insulating film 801 as a mask, a portion of the semiconductor substrate 800 exposed in the opening is selectively removed by a dry etching using a dry etcher for deeply etching silicon, thereby forming a penetrating electrode formation trench 802 in the semiconductor substrate 800. In this process, the etching depth of the semiconductor substrate 800 is, for example, 50 μm or more, and this etching is completed midway through the thickness of the semiconductor substrate 800.

Figure 15B:
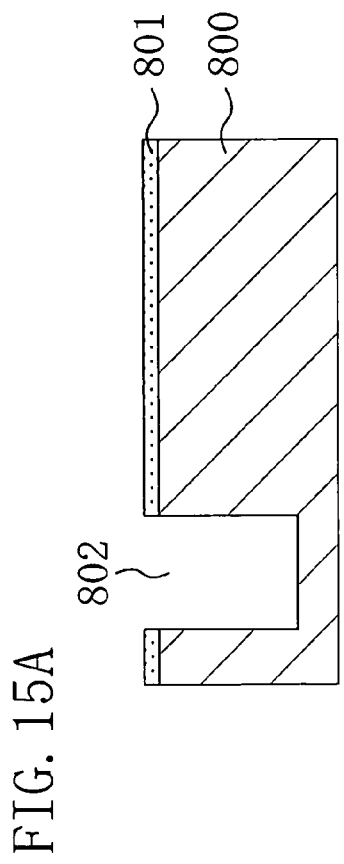

Next, as shown in FIG. 15B, by a CVD method, for example, an insulating film 803 for side-wall insulating film formation made of a TEOS oxide film is deposited on the top surface of the first insulating film 801 and the bottom surface and side wall of the penetrating electrode formation trench 802. A seed layer (not shown) is formed in the penetrating electrode formation trench 802, and then by an electroless plating technique, a conductive material 804 is grown on the insulating film 803 for side-wall insulating film formation to fill the penetrating electrode formation trench 802.

Figure 15C:
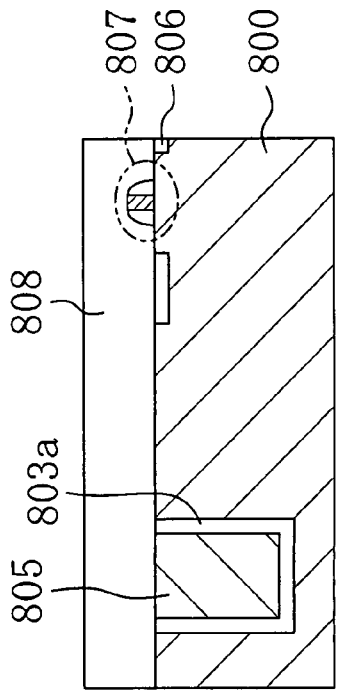

Subsequently, as shown in FIG. 15C, by a CMP technique, a portion of the conductive material 804 existing on the top of the semiconductor substrate 800 is selectively removed, and by a dry etching, a wet etching, or the like, portions of the insulating film 801 and the insulating film 803 for side-wall insulating film formation existing on the top of the semiconductor substrate 800 are selectively removed. Thereby, in the penetrating electrode formation trench 802, a penetrating electrode 805 filling the conductive material is formed with the side-wall insulating film 803a interposed therebetween.

Figure 15D:
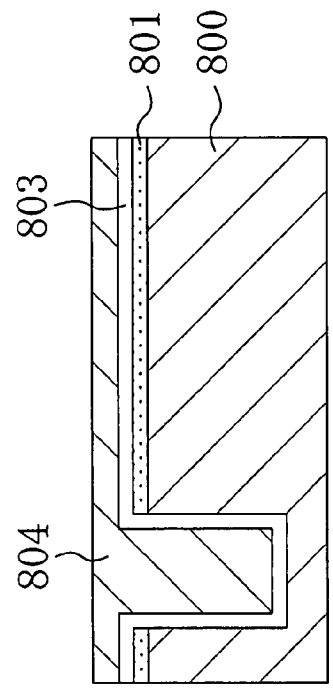

As shown in FIG. 15D, by a known fabrication method of a semiconductor integrated circuit device, an isolation film 806 is formed in the surface of the semiconductor substrate 800, and an element such as a transistor 807 is formed in an active region of the semiconductor substrate 800 surrounded with the isolation film 806. Subsequently, on the semiconductor substrate 800, a first interlayer insulating film 808 is deposited to cover the transistor 807.

Figure 16A:
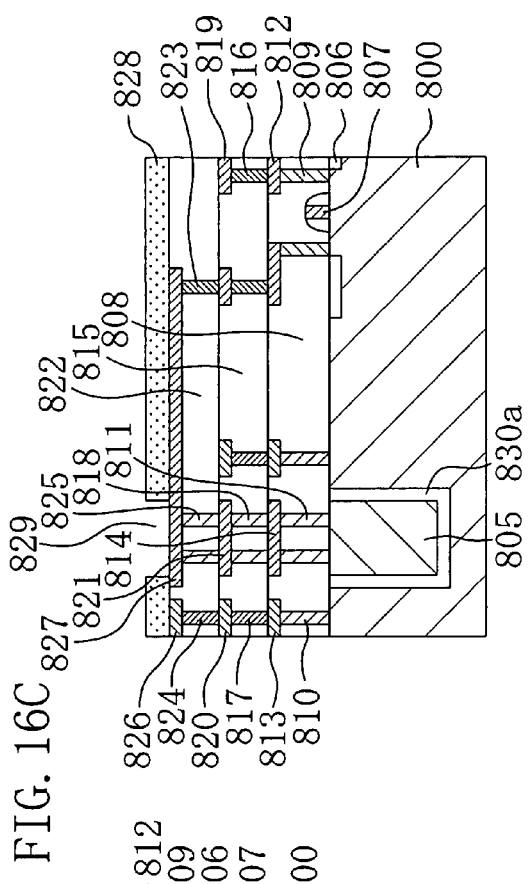
FIGS. 16A to 16D are sectional views showing main process steps of the method for fabricating a semiconductor integrated circuit device according to the eighth embodiment of the present invention.

Next, as shown in FIG. 16A, by a lithography and a dry etching, the first interlayer insulating film 808 is formed with: a ring-shaped contact hole for element connection reaching the active region of the semiconductor substrate 800; a ring-shaped contact hole for a shielding interconnect reaching the semiconductor substrate 800; and a ring-shaped via hole for penetrating-electrode connection reaching the top surface of the penetrating electrode 805. Thereafter, the inside of the contact hole for element connection, the inside of the contact hole for a shielding interconnect, and the inside of the via hole for penetrating-electrode connection are filled with a conductive material to form, in the first interlayer insulating film 808, a ring-shaped contact 809 for element connection connected at its bottom end to the active region of the semiconductor substrate 800, a ring-shaped contact 810 for a shielding interconnect connected at its bottom end to the semiconductor substrate 800, and a ring-shaped via 811 for penetrating-electrode connection connected at its bottom surface to the top surface of the penetrating electrode 805. Then, by a lithography and a dry etching, the first interlayer insulating film 808 is formed with: a ring-shaped first element interconnect recess reaching the top end of the contact 809 for element connection; a ring-shaped first interconnect recess for a shielding interconnect reaching the top end of the contact 810 for a shielding interconnect; and a recess for a first electrode reaching the top end of the via 811 for penetrating-electrode connection. The inside of the first element interconnect recess, the inside of the first interconnect recess for a shielding interconnect, and the inside of the recess for a first electrode are filled with a conductive material to form: a ring-shaped first element interconnect 812 connected at its bottom surface to the top end of the contact 809 for element connection; a ring-shaped first interconnect 813 for a shielding interconnect connected at its bottom surface to the top end of the contact 810 for a shielding interconnect; and a first electrode 814 connected at its bottom surface to the top end of the via 811 for penetrating-electrode connection.

Figure 16B:
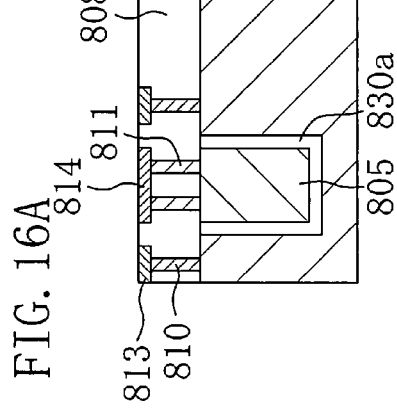

As shown in FIG. 16B, a second interlayer insulating film 815 is deposited on the first interlayer insulating film 808. Then, by a lithography and a dry etching, the second interlayer insulating film 815 is formed with: a ring-shaped first via hole for making connection between element interconnects, which reaches the top surface of the first element interconnect 812; a ring-shaped first via hole for a shielding interconnect, which reaches the top surface of the first interconnect 813 for a shielding interconnect; and a ring-shaped first via hole for making connection between electrodes, which reaches the top surface of the first electrode 814. Subsequently, by a lithography and a dry etching, the second interlayer insulating film 815 is formed with: a ring-shaped second element interconnect recess communicated with the first via hole for making connection between element interconnects; a ring-shaped second interconnect recess for a shielding interconnect communicated with the first via hole for a shielding interconnect; and a recess for a second electrode communicated with the first via hole for making connection between electrodes.

Subsequently, the inside of the first via hole for making connection between element interconnects and the second element interconnect recess, the inside of the first via hole and the second interconnect recess for a shielding interconnect, and the inside of the first via hole for making connection between electrodes and the recess for a second electrode are filled with a conductive material to form, in the second interlayer insulating film 815, a ring-shaped second element interconnect 819 connected at its bottom surface to the top end of a ring-shaped first via 816 for making connection to element interconnects, a ring-shaped second interconnect 820 for a shielding interconnect connected at its bottom surface to the top end of a ring-shaped first via 817 for a shielding interconnect, and a second electrode 821 connected at its bottom surface to the top end of a ring-shaped first via 818 for making connection between electrodes.

Figure 16C:
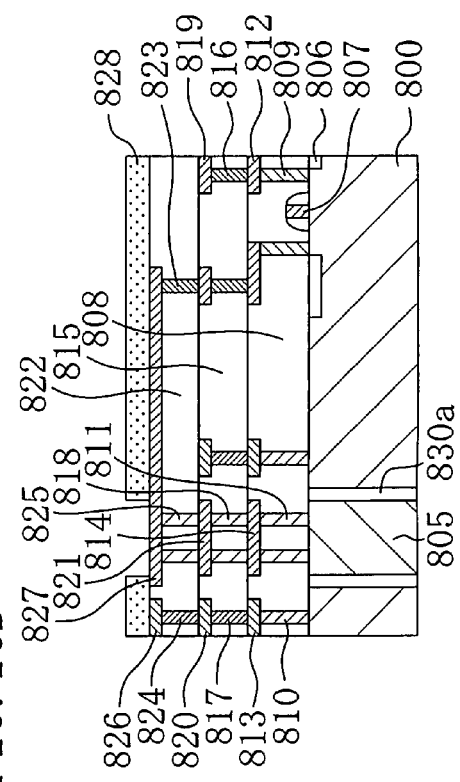

For brevity of description, in the fabrication method of the eighth embodiment, a formation step of an interconnect layer serving as the topmost layer is conducted in the next step shown in FIG. 16C. However, in the actual fabrication method, the step shown in FIG. 16C may be repeatedly conducted to form a multilayer interconnection substrate in which a greater number of interconnect layers are multilayered.

Next, as shown in FIG. 16C, a third interlayer insulating film 822 is deposited on the second interlayer insulating film 815. By a lithography and a dry etching, the third interlayer insulating film 822 is formed with: a C-shaped second via hole for making connection between element interconnects, which reaches the top surface of the second element interconnect 819; a C-shaped second via hole for a shielding interconnect, which reaches the top surface of the second interconnect 820 for a shielding interconnect; and a ring-shaped second via hole for making connection between electrodes, which reaches the top surface of the second electrode 821. Subsequently, by a lithography and a dry etching, the third interlayer insulating film 822 is formed with: a C-shaped third interconnect recess for a shielding interconnect communicated with the second via hole for a shielding interconnect; and a recess for a third electrode communicated with the second via hole for making connection between electrodes and the second via hole for making connection between element interconnects. The inside of the second via hole for making connection between element interconnects, the inside of the second via hole for a shielding interconnect and the third interconnect recess for a shielding interconnect, and the inside of the second via hole for making connection between electrodes and the recess for a third electrode are filled with a conductive material to form: a C-shaped third interconnect 826 for a shielding interconnect which is connected at its bottom surface to the top end of a C-shaped second via 824 for a shielding interconnect; and a third electrode 827 connected at its bottom surface to the top end of a C-shaped second via 823 for making connection between element interconnects and the top end of a ring-shaped second via 825 for making connection between electrodes.

In this structure, as shown in FIG. 16C, the third electrode 827 is connected at its bottom surface to the top end of the second via 823 for making connection between element interconnects, and out of the first, second, and third electrodes 814, 821, and 827 formed in the first, second, and third interlayer insulating films 808, 815, and 822, respectively, the third electrode 827 formed in the third interlayer insulating film 822 as the topmost layer is electrically connected to an internal circuit.

Also, in this structure, as shown in FIG. 16C, in the third interlayer insulating film 822 formed with the third electrode 827 electrically connected to the internal circuit of an element or the like, the second via 824 and the third interconnect 826 for a shielding interconnect provided therein are formed to have not a ring shape but a C-shape. Thus, it is necessary to control the shapes of the via and the interconnect for a shielding interconnect in order not to bring the electrode electrically connected to the internal circuit into contact with the via and the interconnect for a shielding interconnect.

Subsequently, as shown in FIG. 16C, for example, a first insulating film 828 made of a nitride film is deposited on the third interlayer insulating film 822. By a lithography and a dry etching, the first insulating film 828 is formed with an opening 829 exposing a portion of the top surface of the third electrode 827.

Figure 16D:
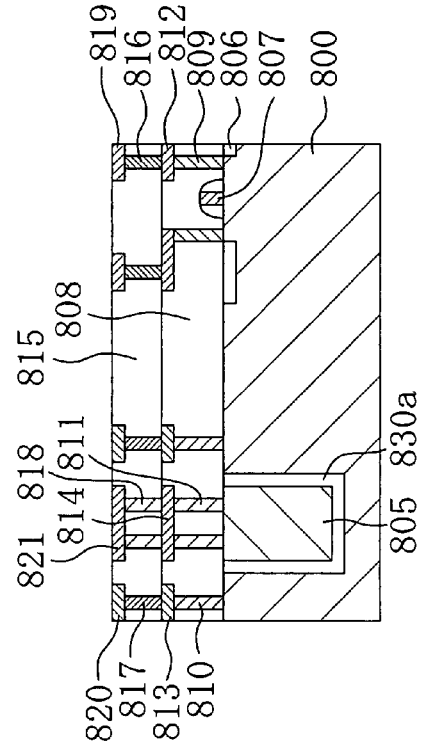
Figure 17:
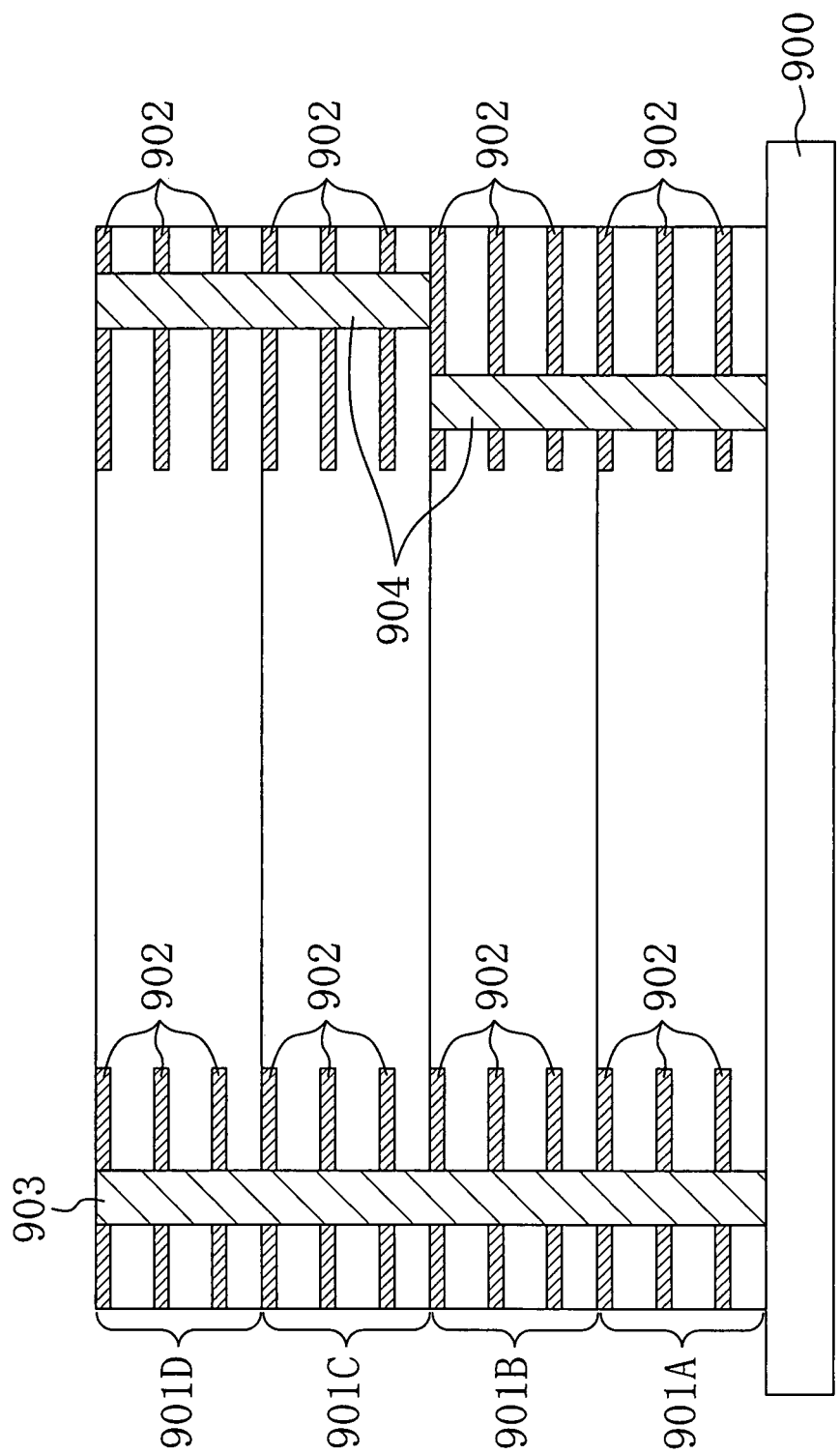
FIG. 17 is a schematic cross-sectional view showing the structure of a semiconductor integrated circuit device according to a conventional example.

As shown in FIG. 16D, the bottom surface of the semiconductor substrate 800 is polished to expose the bottom surface of the penetrating electrode 805.

Thereafter, although not shown, a second insulating film (see 830 in FIG. 14) is deposited on the bottom surface of the semiconductor substrate 800. Then, by a lithography and a dry etching, a portion of the second insulating film existing on the bottom surface of the penetrating electrode 805 is selectively removed.

In the manner described above, the semiconductor chip as shown in FIG. 14 is fabricated which has the penetrating electrode 805 penetrating only the semiconductor substrate 800 and the shielding interconnect 831 arranged to surround the penetrating electrode 805.

In this chip, the penetrating electrode 805 is electrically connected to the via 811 for penetrating-electrode connection formed in the third interlayer insulating film 822 as the bottommost layer.

Also in this chip, the shielding interconnect 831 is constructed in the manner in which the contact 810 for the shielding interconnect, the first interconnect 813 for the shielding interconnect, the first via 817 for the shielding interconnect, the second interconnect 820 for the shielding interconnect, the second via 824 for the shielding interconnect, and the third interconnect 826 for a shielding interconnect are electrically connected in the listed order from bottom to top.

The semiconductor chips fabricated in the manner described above are stacked on a semiconductor package, and the penetrating electrodes of the respective semiconductor chips are electrically connected to each other. Thereby, the semiconductor integrated circuit device can be fabricated in which the penetrating electrodes electrically connect the electrodes of the semiconductor chips to the semiconductor package.

With the method for fabricating a semiconductor integrated circuit device according to the eighth embodiment, the penetrating electrode 805 penetrating only the semiconductor substrate 800 is electrically connected to the via 811 for penetrating-electrode connection formed in the first interlayer insulating film 808 as the bottommost layer.

Thus, the penetrating electrode 805 penetrating only the semiconductor substrate 800 can be formed to secure a good filling of the penetrating electrode formation trench 802 with the conductive material as compared with the case like the conventional example where the penetrating electrode penetrating the interlayer insulating films and the silicon substrate is formed. Therefore, degradation in the yield due to the imperfect contact between the penetrating electrode and the electrode can be prevented.

Moreover, with the method for fabricating a semiconductor integrated circuit device according to the eighth embodiment, the number of steps conducted in the formation process of the penetrating electrode can be reduced as compared with the case like the fifth to seventh embodiments described above where the penetrating electrode is formed which penetrates the third, second, and first interlayer insulating films and the silicon substrate. Therefore, the fabrication cost of the semiconductor integrated circuit device can be reduced.

Furthermore, in the method for fabricating a semiconductor integrated circuit device according to the eighth embodiment, the shielding interconnect 831 is arranged in the vicinity of the penetrating electrode 805. To be more specific, the shielding interconnect 831 is arranged which surrounds the via 811 for penetrating-electrode connection, the first, second, and third electrodes 814, 821, and 827, and the first and second vias 818 and 825 for making connection between electrodes electrically connected to the penetrating electrode 805. Thereby, electromagnetic interference such as crosstalk from a penetrating electrode (not shown) adjoining the penetrating electrode 805 and from the internal circuit such as interconnects or elements located in a region formed with the interconnects and elements into the penetrating electrode 805 can be eliminated.

In the eighth embodiment of the present invention, description has been made of the case as a concrete example where the via 811 for penetrating-electrode connection and the first and second vias 818 and 825 for making connection between electrodes have ring shapes. However, the present invention is not limited to this, and the via 811 for penetrating-electrode connection and the first and second vias 818 and 825 for making connection between electrodes may have any shapes capable of electrically connecting the penetrating electrode 805 and the first, second, and third electrodes 814, 821, and 827 to each other.

In the first to eighth embodiments of the present invention, description has been made of the case as a concrete example where the interelectrode connection via has a ring shape formed along the side face of the penetrating electrode, thereby bringing the inner surfaces of the interelectrode connection vias into contact with the whole side face of the penetrating electrode. However, the present invention is not limited to this. For example, even in the case where the side faces of the interelectrode connection vias are brought into contact with part of the whole side face of the penetrating electrode, the same effects as the present invention can be offered.

In the first to eighth embodiments of the present invention, description has been made of the case where the interelectrode connection via is formed between every pair of electrodes of the first, second, and third electrodes which are provided in adjacent layers. However, the present invention is not limited to this.

In the first to eighth embodiments of the present invention, description has been made of the case as a concrete example where out of the multiple electrodes contained in each of the semiconductor chips, an electrode formed in the bottommost one of the layers constituting the chip is electrically connected to an internal circuit of the chip. On the other hand, in the fifth and eighth embodiments, description has been made of the case as a concrete example where out of the multiple electrodes contained in each of the semiconductor chips, an electrode formed in the topmost one of the layers constituting the chip is electrically connected to an internal circuit of the chip. However, the present invention is not limited to these examples. For example, the electrode electrically connected to the internal circuit of the semiconductor chip is not limited to the electrode formed in the bottommost one of the layers or the electrode formed in the topmost one of the layers, and it is sufficient that at least one of the multiple electrodes contained in the semiconductor chip is used thereas. The same effects as the eighth embodiment can also be offered by the case where, for example, another electrode electrically connected to the internal circuit of the semiconductor chip is provided and the provided electrode is electrically connected to at least one of the multiple electrodes.

As is apparent from the above description, the present invention is useful in semiconductor integrated circuit devices with penetrating electrodes and their fabrication methods.

What is claimed is:

1. A semiconductor integrated circuit device made by stacking a plurality of semiconductor chips, comprising:
 a penetrating electrode formed to penetrate the plurality of semiconductor chips;
 each of the plurality of semiconductor chips including:
  a plurality of interconnect layers stacked on a surface of a semiconductor substrate, an interlayer insulating film existing between adjacent ones of the interconnect layers;
  a plurality of electrodes having respective openings within which the penetrating electrode penetrates, each of the plurality of electrodes being included in each of the plurality of interconnect layers; and
  a plurality of vias each of which electrically connects adjacent ones of the plurality of electrodes, each of the adjacent ones of the electrodes being located in each of adjacent ones of the plurality of interconnect layers,
 wherein the plurality of vias are each formed so that a side face thereof is in contact with the penetrating electrode.

2. The device of claim 1, wherein the vias have ring shapes formed along the side face of the penetrating electrode.

3. The device of claim 1, wherein at least one of the plurality of electrodes contained in the semiconductor chip is electrically connected to an internal circuit of the semiconductor chip.

4. The device of claim 1, further comprising a shielding interconnect formed in the vicinity of the penetrating electrode and penetrating the interconnet layers to reach the surface of the semiconductor substrate included in each of the plurality of semiconductor chips.

5. The device of claim 4, wherein the penetrating electrode is formed to penetrate an edge portion of the semiconductor chip, and
 the shielding interconnect is interposed between the penetrating electrode and an internal circuit of the semiconductor chip.

6. The device of claim 4, wherein the penetrating electrode is formed to penetrate a center portion of the semiconductor chip, and
 the shielding interconnect is formed to surround the penetrating electrode.

7. The device of claim 1, further comprising, in an intermediate semiconductor chip located intermediately in the plurality of semiconductor chips, an internal penetrating electrode formed to penetrate center portions of layers constituting the intermediate semiconductor chip,
  wherein the penetrating electrode and the internal penetrating electrode are electrically connected through an interconnect layer formed in the intermediate semiconductor chip, and
  the penetrating electrode and the internal penetrating electrode are connected to a voltage supply source.

8. The device of claim 7, wherein the interconnect layer is formed in a topmost layer of the layers.

9. The device of claim 7,
  wherein the penetrating electrode includes: a first penetrating electrode formed to penetrate the plurality of semiconductor chips; and a second penetrating electrode formed to penetrate the plurality of semiconductor chips and differing from the first penetrating electrode,
  the internal penetrating electrode includes: a first internal penetrating electrode formed to penetrate center portions of the layers; and a second internal penetrating electrode formed to penetrate center portions of the layers and differing from the first internal penetrating electrode,
  the interconnect layer includes: a first interconnect layer; and a second interconnect layer formed on the first interconnect layer,
  the first penetrating electrode and the first internal penetrating electrode are electrically connected through one of the first interconnect layer and the second interconnect layer,
  the second penetrating electrode and the second internal penetrating electrode are electrically connected through the other interconnect layer,
  the first penetrating electrode and the first internal penetrating electrode are connected to the voltage supply source, and
  the second penetrating electrode and the second internal penetrating electrode are connected to another voltage supply source differing from the voltage supply source.

10. The device of claim 1,
  wherein at least one of the plurality of electrodes contained in the semiconductor chip is electrically connected to an internal circuit of the semiconductor chip, and another one of the plurality of electrodes is electrically connected to said at least one of the plurality of electrodes.

11. The device of claim 3,
  wherein another one of the plurality of electrodes contained in the semiconductor chip is electrically connected to the at least one of the plurality of electrodes.

* * * * *